US008434423B2

(12) United States Patent
Toshima et al.

(10) Patent No.: US 8,434,423 B2
(45) Date of Patent: May 7, 2013

(54) SUBSTRATE CARRYING APPARATUS HAVING CIRCUMFERENTIAL SIDEWALL AND SUBSTRATE PROCESSING SYSTEM

(75) Inventors: Takayuki Toshima, Koshi (JP); Kazuo Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 597 days.

(21) Appl. No.: 12/698,455

(22) Filed: Feb. 2, 2010

(65) Prior Publication Data

US 2010/0192992 A1 Aug. 5, 2010

(30) Foreign Application Priority Data

Feb. 4, 2009 (JP) ................................ 2009-024025

(51) Int. Cl.

| | |
|---|---|
| ***B05C 13/00*** | (2006.01) |
| ***B05C 11/00*** | (2006.01) |
| ***B05C 3/00*** | (2006.01) |
| ***C23C 16/00*** | (2006.01) |
| ***G03D 5/00*** | (2006.01) |
| *B08B 6/00* | (2006.01) |
| *C23F 1/00* | (2006.01) |

(52) U.S. Cl.
USPC ............... 118/503; 118/50; 118/73; 118/421; 118/719; 396/611; 134/12; 156/345.5

(58) Field of Classification Search .................. 134/133, 134/140, 902; 355/72; 118/421, 73
See application file for complete search history.

(56) References Cited

U.S. PATENT DOCUMENTS 5,618,351 A * 4/1997 Koble et al. .................. 118/728
5,891,253 A * 4/1999 Wong et al. .................. 118/726
6,550,484 B1 * 4/2003 Gopinath et al. .............. 134/1.2
6,746,196 B1 * 6/2004 Ozawa et al. ................. 414/217
7,087,118 B2 * 8/2006 Kitano et al. ................. 118/690
7,563,042 B2 * 7/2009 Nakaharada et al. ......... 396/611
8,021,513 B2 * 9/2011 Wakabayashi ........... 156/345.24
2003/0121535 A1 * 7/2003 Biberger et al. ............. 134/25.4
2008/0185370 A1 * 8/2008 Fukuoka et al. .............. 219/385
2010/0227046 A1 * 9/2010 Kato et al. ...................... 427/10
2010/0227059 A1 * 9/2010 Kato et al. ............... 427/255.28
2011/0126985 A1 * 6/2011 Ohizumi et al. ......... 156/345.55
2011/0290175 A1 * 12/2011 Paranjpe et al. ................ 117/85

FOREIGN PATENT DOCUMENTS

JP 7-17628 A 1/1995
JP 2003-282666 A 10/2003

* cited by examiner

*Primary Examiner* — Dah-Wei Yuan
*Assistant Examiner* — Karl Kurple
(74) *Attorney, Agent, or Firm* — Abelman, Frayne & Schwab

(57) ABSTRACT

Disclosed is a substrate carrying apparatus having a simple configuration capable of inhibiting the occurrence of pattern collapse. A carrying tray of the disclosed substrate carrying apparatus includes a bottom plate for supporting the substrate and a circumferential side wall being provided around the bottom plate. An opening is formed in the bottom plate. An elevating member, to and from which the substrate is to be transferred, passes through the opening. A space is temporarily formed in a carrying tray. The elevating member within the opening passes to the outside of the carrying tray through the space. When the substrate is carried, the liquid is reservoired within the carrying tray, and the substrate is carried while the liquid remained on the upper surface of the substrate.

6 Claims, 22 Drawing Sheets

5 51 511 512 56 641 651 652 642 55 52 54 521 522 53 50

1
14
201
141
controller
7
2
3
4
W
13
131
132
12
121
122
11
C 4
48
exhaust
purge
HFE
412
481
413
424
40
463
W
421
411
41
HFE
42
43
432
433
431
45
452
451
462
461
423
44
controller
7

SUBSTRATE CARRYING APPARATUS HAVING CIRCUMFERENTIAL SIDEWALL AND SUBSTRATE PROCESSING SYSTEM

This application is based on and claims priority from Japanese Patent Application No. 2009-024025, filed on Feb. 4, 2009, with the Japanese Patent Office, the disclosure of which is incorporated herein in its entirety by reference.

TECHNICAL FIELD

The present disclosure relates to a technology for carrying a substrate, such as a semiconductor wafer, to a substrate processing apparatus which performs washing or supercritical processing on the substrate with a pattern formed on the surface thereof.

BACKGROUND

A fabrication process of a semiconductor device for forming a layered structure of an integrated circuit on the surface of a substrate, for example, a semiconductor wafer (hereinafter, referred to as a wafer), includes a liquid processing process for removing fine particles or a natural oxide film on the surface of the wafer by a chemical liquid.

A single-wafer type spin washing apparatus, as a liquid processing apparatus used for the liquid processing process above, removes particles or a natural oxide film on the surface of the wafer by rotating the wafer while supplying an alkaline or acidic liquid to the surface of the wafer by a nozzle. In this case, the liquid remained on the surface of the wafer is removed through spin-drying by the rotation of the wafer, after a rinsing process is performed by pure water.

However, as a semiconductor device is highly integrated, so-called a pattern collapse has become serious in the process of removing such a liquid. The pattern collapse indicates a phenomenon where in the drying of the liquid remained on the surface of the wafer, when the liquid remained on the left and right sides of a projection portion of unevenness forming a pattern is non-uniformly dried, the balance between leftward and rightward surface tensions on the projection portion is collapsed, and thereby the projection portion is collapsed in the direction of the side that the liquid remains in a larger amount.

As a method for removing the liquid remained on the surface of a wafer and inhibiting such pattern collapse, there has been known a drying method using a supercritical-state fluid (supercritical fluid). A supercritical fluid has a lower viscosity, compared to a liquid, and also a high liquid-solubility. Besides, in the supercritical fluid, there exists no interface between liquid and gas. Accordingly, when a wafer with a chemical liquid remained thereon comes in contact with the supercritical fluid and the chemical liquid on a wafer surface is dissolved in the supercritical fluid, it is possible to dry the chemical liquid without an influence of surface tension.

Herein, the supercritical state requires a certain condition, such as high temperature and high pressure. Thus, after being washed and rinsed by a chemical liquid, a wafer with the liquid remained thereon is carried to a supercritical processing device for supercritical drying. However, when the liquid on a wafer surface is naturally dried during the carrying of the wafer from a liquid processing apparatus to the supercritical processing device, pattern collapse may occur by a process of the natural drying.

As a technology for carrying a wafer while inhibiting the surface of the wafer from being naturally dried, Japanese Laid-Open Patent Publication HEI. No. 7-17628 (see [0011] and FIG. 1) and Japanese Registered Patent Publication No. 3933507 (see [0030] and FIG. 3b) disclose wafer carrying methods, in which a cover-type member covers the surface of a wafer, and a wafer is carried in a state where a space between the cover-type member and the wafer is filled with a liquid.

In the method disclosed in Japanese Laid-Open Patent Publication HEI No. 7-17628, the wafer can be adhesively supported by the liquid filled between the cover-type member and the wafer, and can be carried without the support on the lower surface of the wafer. However, the liquid is likely to overflow from the space between the wafer and the cover-type member. Meanwhile, in the method disclosed in Japanese Registered Patent Publication No. 3933507, although a receiving plate for receiving the liquid overflowing downward from the wafer is provided, the upper and lower sides of the wafer are required to be covered from both sides. This complicates the configuration of an apparatus or the control on the operation, and causes a reduction of throughput, due to a prolonged carrying time.

SUMMARY

According to one embodiment, there is provided a substrate carrying apparatus to carry a substrate with a liquid remained thereon, and to transfer the substrate to and from an elevating member supporting a back surface of the substrate. The substrate carrying apparatus includes a carrying tray including a bottom plate supporting the substrate on an upper surface of the bottom plate and a circumferential side wall being provided around an area for supporting the substrate at the bottom plate, an opening formed in a bottom plate of the carrying tray so that the elevating member passes through the opening, a carrying tray moving mechanism to horizontally move the carrying tray, and a space forming mechanism to temporarily form a space so that the elevating member passes through the space from the opening to outside of the carrying tray when the carrying tray is horizontally moved. The bottom plate, the substrate supported by the bottom plate, and the circumferential side wall form a liquid reservoir space when the substrate is carried.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
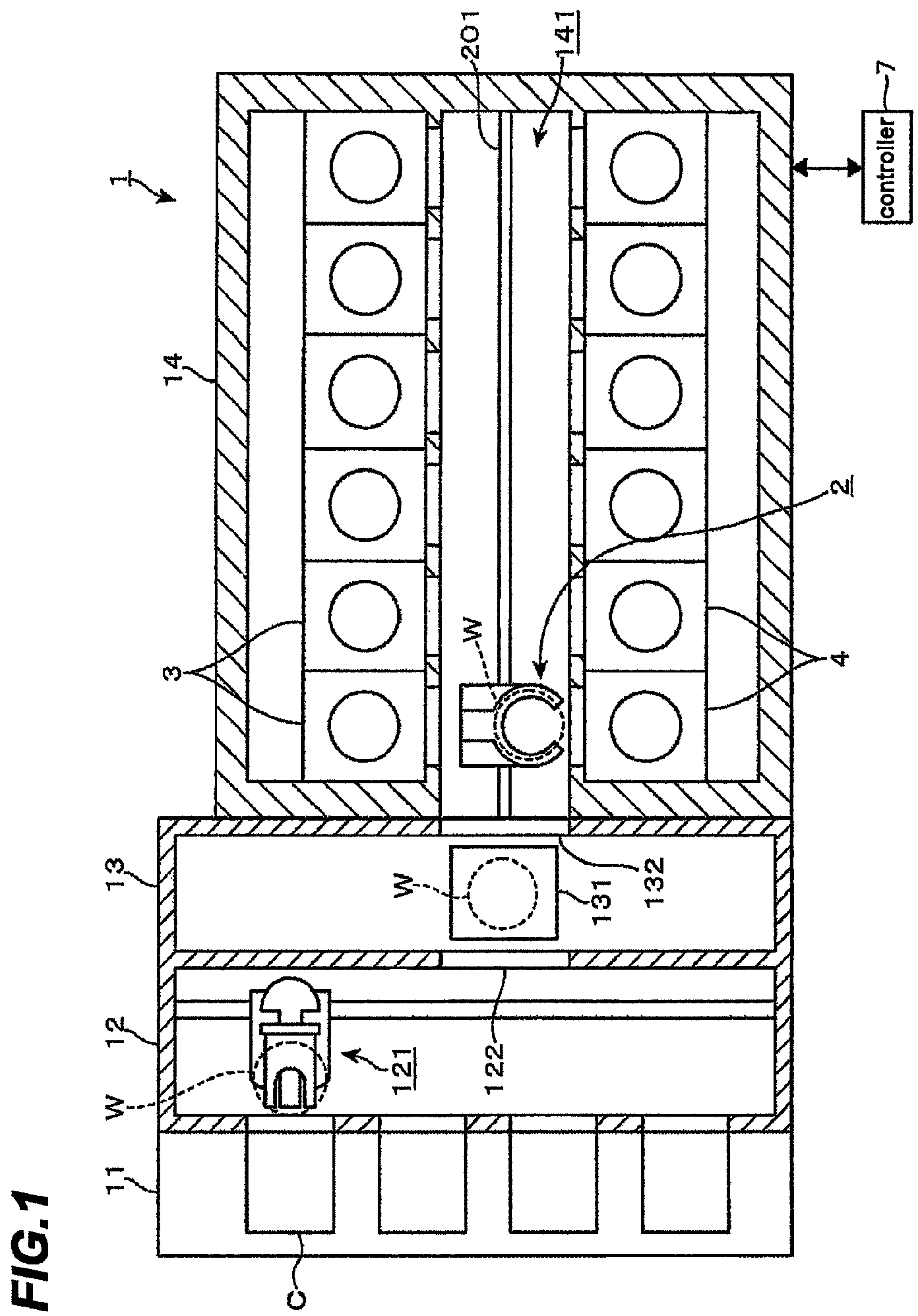
FIG. 1 is a cross-sectional plan view illustrating the entire configuration of a liquid processing system according to one embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a substrate carrying apparatus having a simple configuration capable of inhibiting the occurrence of pattern collapse, and a substrate processing system provided with the same.

According to one embodiment, there is provided a substrate carrying apparatus to carry a substrate with a liquid remained thereon, and to transfer the substrate to and from an elevating member supporting a back surface of the substrate. The substrate carrying apparatus includes a carrying tray including a bottom plate supporting the substrate on an upper surface of the bottom plate and a circumferential side wall being provided around an area for supporting the substrate at the bottom plate, an opening formed in a bottom plate of the carrying tray so that the elevating member passes through the opening, a carrying tray moving mechanism to horizontally move the carrying tray, and a space forming mechanism to temporarily form a space so that the elevating member passes through the space from the opening to outside of the carrying tray when the carrying tray is horizontally moved. The bottom plate, the substrate supported by the bottom plate, and the circumferential side wall form a liquid reservoir space when the substrate is carried.

The carrying tray may include two divided tray members across the opening, and the space forming mechanism includes a tray member moving unit to move the tray members between a position where the tray members are put together, and a position where a pass-through space for the elevating member is formed between the tray members.

The substrate may be carried while being immersed in the liquid reservoired within the liquid reservoir space.

A drainage line may be provided on the bottom plate between the circumferential side wall and the area for supporting the substrate. The drainage line is adapted to discharge the liquid within the liquid reservoir space, and includes an open/close valve.

According to another embodiment, there is provided a substrate processing system including liquid processing apparatus to supply a liquid on a surface of a substrate to wash the surface, a supercritical processing apparatus to perform processing by a supercritical-state processing fluid on the substrate loaded into the processing receptacle from the liquid processing apparatus, thereby removing the liquid remained on the substrate by the liquid processing apparatus from the substrate, and the above described substrate carrying apparatus to carry the substrate to and from the liquid processing apparatus and the supercritical processing apparatus.

The liquid processing apparatus may supply a liquid to the substrate supported by a carrying tray, and the substrate carrying apparatus may carry the substrate with the liquid remained thereon. The liquid is the same kind of liquid as a fluid to be placed in a supercritical-state by the supercritical processing apparatus.

The liquid processing apparatus may supply a liquid to the substrate supported by a carrying tray, and the substrate carrying apparatus may carry the substrate with the liquid remained thereon. The liquid is the different kind of liquid from a fluid to be placed in a supercritical-state by the supercritical processing apparatus.

According to the present disclosure, a liquid is reservoired in a carrying tray supporting a substrate, and the substrate with the liquid remained on an upper surface thereof is carried. Thus, through an apparatus with a simple configuration, the collapse of a pattern formed on the surface of the substrate may be inhibited. Also, compared to a conventional case for carrying a substrate in a state where a liquid is filled within a space formed by covering the upper and lower surfaces of the substrate, the apparatus configuration or the operation control can be simple. Moreover, the reduction in a carrying time can contribute to the improvement of throughput. Also, in the bottom plate of the carrying tray, an opening is formed. The opening allows an elevating member provided in a substrate processing apparatus (to which the substrate is transferred) to be passed therethrough, the substrate processing apparatus. Also, in the carrying tray, a space is temporarily formed during the transfer of the substrate. The space is for passing the elevating member through from the opening to the outside of the carrying tray, which allows the carrying tray to be horizontally moved without interference with the elevating member.

Hereinafter, as one example of a substrate processing system provided with a supercritical processing apparatus according to the present disclosure, an embodiment of a liquid processing system 1 for performing liquid processing on a wafer W as a substrate by the supply of a chemical liquid, and performing supercritical drying will be described. FIG. 1 shows a cross-sectional plan view illustrating the entire configuration of liquid processing system 1. When the left side in FIG. 1 is referred to as a front area, liquid processing system 1 includes a carrier seating unit 11 on which a carrier C receiving a plurality of wafers W is seated, a carrying unit 12 for drawing out wafer W from the carrier C and loading it into liquid processing system 1, a transfer unit 13 for transferring wafer W drawn out by carrying unit 12 to a liquid processing unit 14 at the rear area, and liquid processing unit 14 for performing liquid processing and supercritical drying by sequentially loading wafer W transferred from transfer unit 13 in a liquid processing apparatus 3, and a supercritical processing apparatus 4, which are connected to each other in this order from the front area.

Carrier seating unit 11 is configured as a seating unit capable of seating, for example, 4 carriers C, and performs a role of fixing each carrier C seated on carrier seating unit 11, and connecting it with carrying unit 12. Carrying unit 12 has a structure in which an opening/closing device (not shown) for opening/closing an open/close door provided at a surface in contact with each carrier C, and a carrying device 121 for drawing out wafer W from carrier C and carrying it to transfer unit 13 are provided within a common case. Carrying device 121 is capable of advancing and retreating in the front and rear directions, and moving in the left and right directions, and includes a rotatable and elevatable carrying arm and a driving unit thereof. Carrying device 121 performs a role of loading/unloading wafer W in/out of transfer unit 13 via a first opening 122 provided in a partition wall between carrying unit 12 and transfer unit 13.

Transfer unit 13 has a space within a case provided at a position between carrying unit 12 and liquid processing unit 14. For example, between first opening 122 at the carrying unit 12 side, and a second opening 132 provided in the partition wall at the liquid processing unit 14 side, a transfer tray 131 is provided. Transfer tray 131 disposes wafer W which is to be or has been subjected to liquid processing. In transfer tray 131, 8 wafers W may be disposed. Transfer tray 131 plays a role as a buffer for temporarily disposing wafer W loaded from the carrying unit 12 side, and wafer W unloaded from the liquid processing unit 14 side.

Liquid processing unit 14 includes, within a case connected to the rear end of transfer unit 13, liquid processing apparatus 3 for performing liquid processing on wafer W, and supercritical processing apparatus 4 for removing a processing liquid remained on wafer W by the liquid processing. Within liquid processing unit 14, a carrying path 141 for wafer W is provided. Carrying path 141 extends in a front-rear direction from the above mentioned second opening 132 provided in the partition wall between liquid processing unit 14 and transfer unit 13. For example, 6 liquid processing apparatuses 3 are provided at the left side from the perspective of second opening 132 in a row along carrying path 141, and 6 supercritical processing apparatuses 4 are provided at the right side in a row while facing the row of liquid processing apparatuses 3.

Within carrying path 141, a wafer carrying apparatus 2 according to the present embodiment is provided. Wafer carrying apparatus 2 is capable of moving along carrying path 141 and advancing and retreating toward liquid processing apparatuses 3 and supercritical processing apparatuses 4 provided on the left and right sides of carrying path 141, and is configured to be rotatable and elevatable. Wafer carrying apparatus 2 can carry wafer W between the above mentioned transfer tray 131, liquid processing apparatuses 3, and supercritical processing apparatuses 4. Wafer carrying device 2 according to the present embodiment has a function of carrying wafer W into supercritical processing apparatus 4 from liquid processing apparatus 3 while contacting wafer W with a liquid in order to inhibit the occurrence of pattern collapse of wafer W. Its detailed configuration will be described later.

Although one wafer carrying apparatus 2 is provided in FIG. 1, liquid processing unit 14 may include two or more wafer carrying apparatuses 2 according to the number of provided liquid processing apparatuses 3 or provided supercritical processing apparatuses 4.

Figure 2:
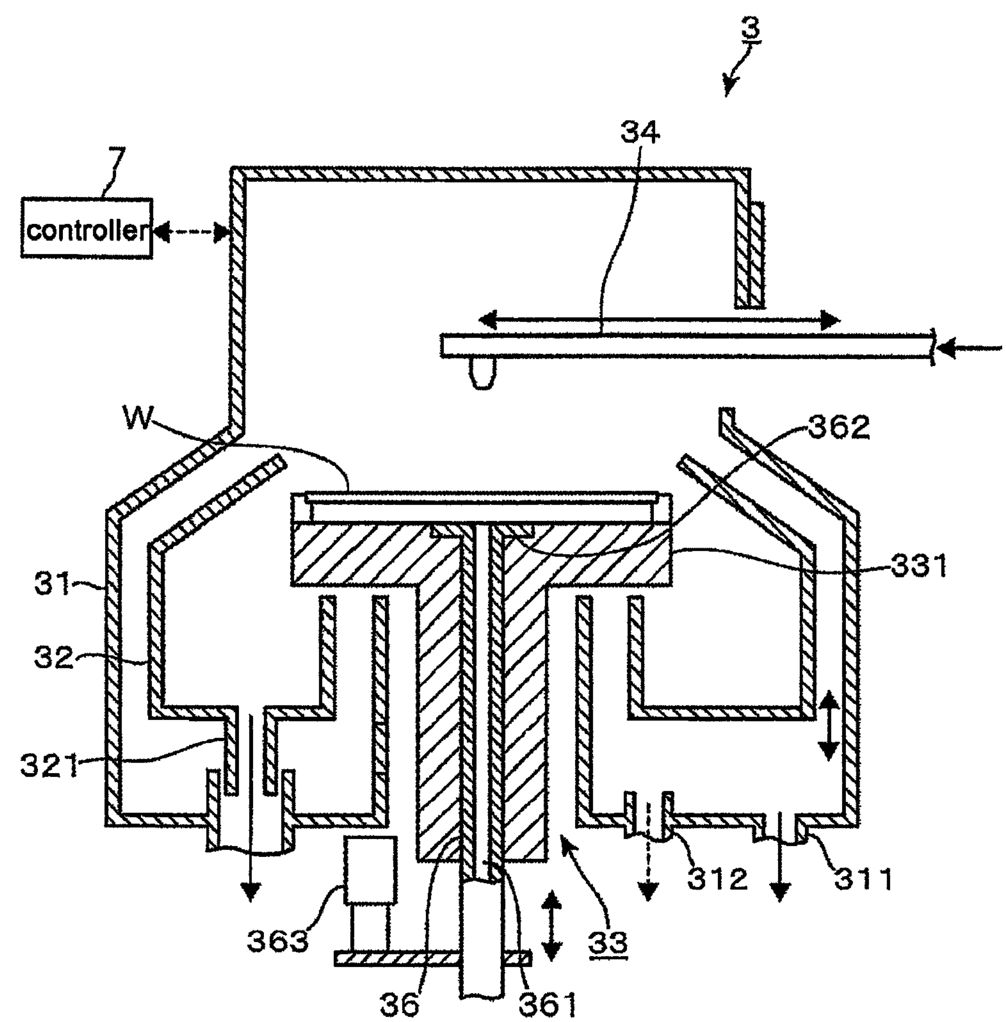
FIG. 2 is a vertical-sectional side view illustrating the configuration of a liquid processing apparatus provided in the liquid processing system.

As shown in FIG. 2, liquid processing apparatus 3 includes an outer chamber 31, a wafer supporting means 33, a nozzle arm 34, and an inner cup 32. Outer chamber 31 forms an enclosed processing space in which liquid processing and rinsing are performed, respectively, on wafer W. Wafer supporting means 33 rotates wafer W while nearly horizontally supporting wafer W, which is provided within outer chamber 31. Nozzle arm 34 includes a nozzle to supply a chemical liquid and a rinsing liquid to the upper surface side of wafer W supported by wafer supporting means 33, and another nozzle to supply HFE which will be described below. Inner cup 32 receives the chemical liquid scattered from the rotating wafer W to the vicinity, which is provided within outer chamber 31 in such a manner that it can surround wafer supporting means 33. Liquid processing apparatus 3 corresponds to a first processing apparatus in the present embodiment, which transfers and receives wafer W to and from wafer carrying apparatus 2.

Outer chambers 31 are provided in separate cases from adjacent different liquid processing apparatuses 3 as shown in FIG. 1, and wafer W is loaded/unloaded by wafer carrying apparatus 2 via a wafer loading/unloading hole (not shown). In the drawing, the reference numeral 311 denotes a drain hole for discharging a chemical liquid reservoired at the bottom portion of outer chamber 31, and the reference numeral 312 denotes an exhaust hole for the exhaust of the inside of outer chamber 31.

Wafer supporting means 33 is a cylindrical member with an under plate 331 provided at the upper portion thereof. Under plate 331 is provided to face the back surface of a horizontally supported wafer W. Wafer supporting means 33 is configured to supply, to the lower surface of a rotating wafer W, a SC1 liquid (ammonia-hydrogen peroxide solution) as an alkaline chemical liquid for removing particles or organic polluting substances on the surface of wafer W, diluted hydrofluoric acid (hereinafter, referred to as a DHF liquid) as an acidic chemical liquid for removing a natural oxide film on wafer W surface, and pure water for rinsing off these chemical liquids, via a chemical liquid supply path 361 formed therewithin.

The above described chemical liquid supply path 361 is formed within a lifter 36 provided within wafer supporting means 33. At the upper portion of lifter 36, a wafer supporting part 362 is provided. Wafer supporting part 362 transfers wafer W to/from wafer carrying apparatus 2, and takes, for example, a disk shape. Chemical liquid supply path 361 is opened to the center of the upper portion of wafer supporting part 362. The lower portion of chemical liquid supply path 361 is connected to an elevating mechanism 363, and wafer supporting part 362 is configured to be projected and retracted from the upper surface of under plate 331 by elevating mechanism 363. When projected, wafer supporting part 362 is moved up to the transfer position where wafer W is transferred to/from wafer carrying apparatus 2, and when retracted, the upper surface of wafer supporting part 362 has the same height with the upper surface of under plate 331. Lifter 36 and wafer supporting part 362 correspond to elevating members of the present embodiment.

Nozzle arm 34 includes, at the leading end portion, a nozzle for supplying a chemical liquid. From the nozzle, the above mentioned SC1 liquid, the DHF liquid, and the pure water for rinsing off these chemical liquids, may be supplied to the upper surface of wafer W. Nozzle arm 34 is configured to be movable by a driving means (not shown), between the upper portion at the center of wafer W supported by wafer supporting means 33, and the waiting position at the outside of outer chamber 31.

Inner cup 32 is configured to be moved up and down, between a processing position where inner cup 32 surrounds the wafer supported by wafer supporting means 33, and a retreat position where inner cup 32 retreats to the lower portion of the processing position. At the bottom portion of inner cup 32, a drain hole 321 for discharging the chemical liquid, which is scattered to the vicinity of wafer W and received at the processing position, is provided.

Figure 3:
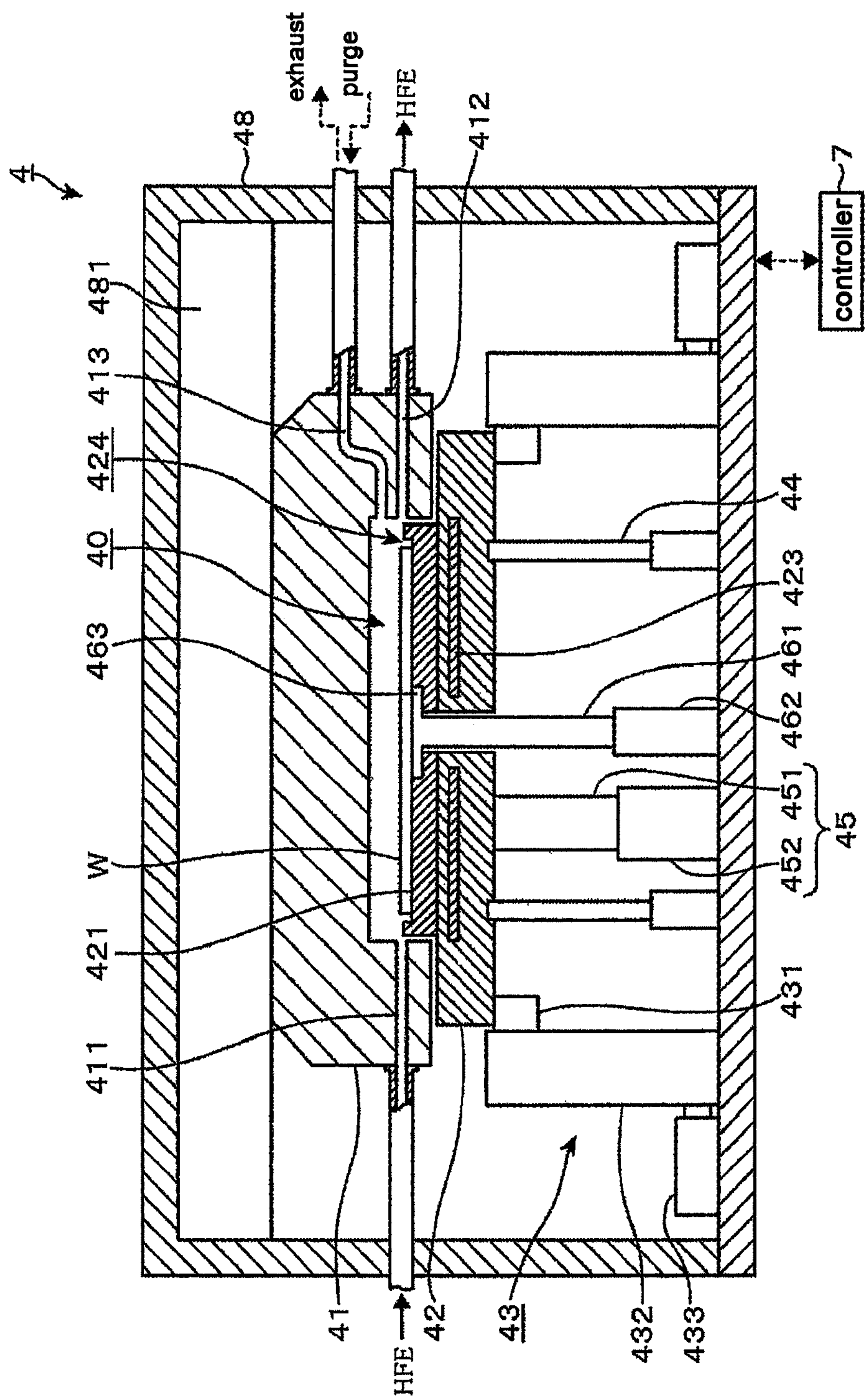
FIG. 3 is a vertical-sectional side view illustrating the configuration of a supercritical processing apparatus provided in the liquid processing system.

Hereinafter, the configuration of supercritical processing apparatus 4 will be described with reference to FIG. 3. Supercritical processing apparatus 4 includes a processing receptacle 41 for performing a supercritical drying process on wafer W, a bottom plate 42 of processing receptacle 41, a means for receiving wafer W into processing receptacle 41, and another means for supplying a processing liquid to processing receptacle 41 to place it in a supercritical state. Supercritical processing apparatus 4 corresponds to a second processing apparatus in the present embodiment, which transfers and receives wafer W to and from wafer carrying apparatus 2.

Processing receptacle 41 is a flat disk-shaped pressure container for receiving wafer W. Processing receptacle 41 forms a processing space 40 for performing a supercritical drying process on wafer W, and has a concave portion formed at the back surface side thereof. Processing receptacle 41 is made of, for example, stainless steel. The concave portion provided at the back surface side of processing receptacle 41 forms processing space 40 for receiving wafer W with a diameter of, for example, 300 mm, by combining with a seating unit 421 (which will be described later) for wafer W.

In processing receptacle 41, three paths 411, 412, and 413 which are opened toward the lateral surface of processing space 40 are formed. The reference numeral 411 denotes an HFE supply path for supplying a processing fluid, such as hydrofluoroether (with a boiling point of, for example, about 70°; hereinafter, referred to as HFE), in a liquid state, into processing space 40. The reference numeral 412 denotes an HFE discharge path for discharging the HFE from processing space 40. The reference numeral 413 denotes an exhaust path for the exhaust of processing space 40. When the FIFE is discharged from processing space 40 through exhaust path 313, exhaust path 413 plays a role of purging the inside of processing space 40 by receiving the atmosphere outside of processing receptacle 41 from exhaust path 413.

Processing receptacle 41 is fixed at the upper portion of a case 48 via a beam type pressing member 481, and the pressing member can put pressure downward on processing receptacle 41 against the high-pressure force from a supercritical fluid within processing space 40.

Bottom plate 42 forms processing space 40 by closing up the concave portion of processing receptacle 41 from the bottom side, and plays a role of supporting wafer W. Bottom plate 42 is made of, for example, stainless steel, and is formed as a disk-shaped member which is larger than the aperture of the concave portion of processing receptacle 41, by one size, for example. At the upper surface of bottom plate 42, seating unit 421 is fixed. Seating unit 421 is made of, for example, stainless steel, and takes a disk shape which can be coupled within the concave portion of processing receptacle 41. At the upper portion of seating unit 421, a concave portion, that is, a wafer disposition area 424, is formed.

Also, bottom plate 42 is configured to be moved up and down by a bottom plate elevating means 45 including a support rod 451 and a driving unit 452 thereof. Bottom plate 42 can move between the transfer position at the downward side where wafer W is transferred to/from wafer carrying apparatus 2, and the processing position for forming processing space 40 by closing up the concave portion of processing receptacle 41 and performing the supercritical drying process on wafer W. In the drawings, the reference numeral 44 denotes a guide member for guiding an elevation path of bottom plate 42 during the elevation, and guide members 44 are disposed at, for example, three positions, nearly equally spaced along the circumferential direction of bottom plate 42.

Herein, the pressure within processing space 40 during the supercritical drying is high, for example, absolute pressure 3 MPa, and thus, a large downward force is applied to bottom plate 42. Accordingly, at the lower portion of bottom plate 42, a support mechanism 43 for supporting the back surface of bottom plate 42 is provided. Support mechanism 43 includes a supporting member 431, a guide member 432, and a driving unit 433. Supporting member 431 supports and presses the back surface of bottom plate 42 toward the processing receptacle 41 side, and moves up and down according to the elevating operation of bottom plate 42. Guide member 432 forms an elevation path of supporting member 431, and driving unit 433 includes, for example, a hydraulic pump. In the same manner as the above described guide members 44, support mechanisms 43 are disposed at, for example, three positions, nearly equally spaced along the circumferential direction of bottom plate 42.

At the center portion of bottom plate 42, a lifter 461 for transferring the wafer from/to wafer carrying apparatus 2 is provided. Lifter 461 passes through nearly the center of bottom plate 42 and seating unit 421 in a top-bottom direction, and has a wafer supporting part 463 fixed at the upper portion thereof and a driving unit 462 provided at the lower portion thereof. Wafer supporting part 463 nearly horizontally supports wafer W, and takes, for example, a disk shape. At the upper surface of seating unit 421, a concave portion for receiving the above described wafer supporting part 463 is formed, in which lifter 461 is moved up and down independently from bottom plate 42 so as to project and retract wafer supporting part 463 from bottom plate 42. Thus, wafer W is transferred between wafer carrying apparatus 2 and wafer disposition area 424. When being received in the concave portion of bottom plate 42, the upper surface of wafer supporting part 463 is placed in the same plane as the upper surface of seating unit 421, that is, wafer disposition area 424. Lifter 461 and wafer supporting part 463 correspond to elevating members of the present embodiment.

Also, within bottom plate 42, a heater 423 including, for example, a heating resistor, is embedded. Heater 423 increases the temperature of the HFE (processing fluid) supplied into processing space 40 up to, for example, 300°, and places the processing fluid in a supercritical state by boosting the inside of processing space 40 up to the above mentioned 3 MPa by using the expansion of the fluid. Heater 423 is connected to a power supply (not shown), and heats the processing fluid within processing space 40 via seating unit 421 and wafer W disposed on the upper surface of seating unit 421 by being heated by the electric power supplied from the power supply.

After being subjected to liquid processing by the above described liquid processing apparatus 3, wafer W is subjected to supercritical drying by supercritical processing apparatus 4. Herein, wafer carrying apparatus 2 according to the present embodiment has a function of carrying wafer W from liquid processing apparatus 3 to supercritical processing apparatus 4 in a state where wafer W contacts with the liquid (wafer W is wet with the liquid), so that the occurrence of pattern collapse caused by natural drying can be inhibited. Hereinafter, the detailed configuration of wafer carrying apparatus 2 will be described with reference to FIG. 1, and FIGS. 4 to 9B.

Figure 4:
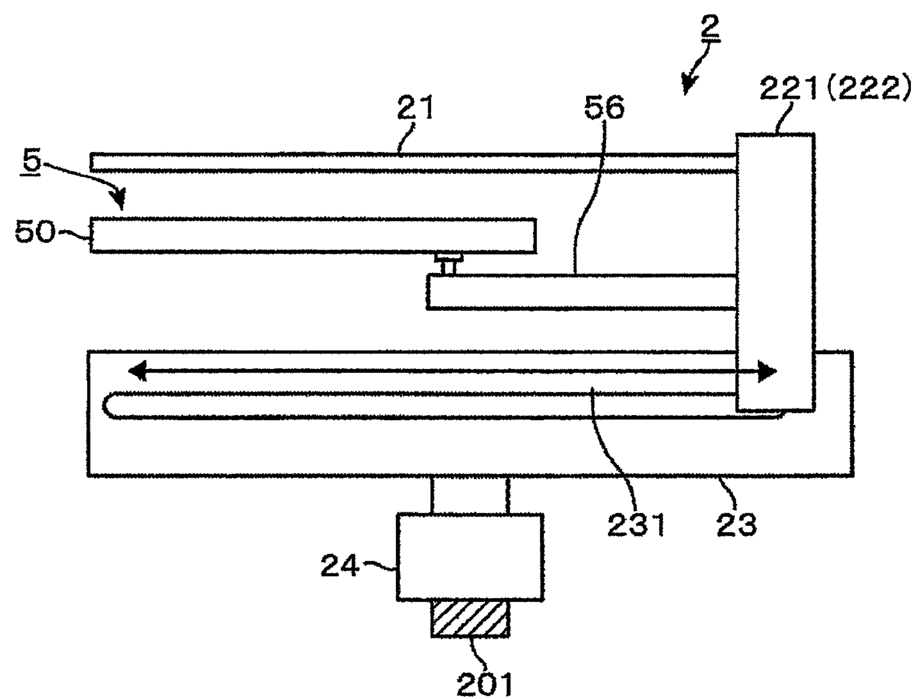
FIG. 4 is a side view illustrating the external configuration of a wafer carrying apparatus provided in the liquid processing system.
Figure 5:
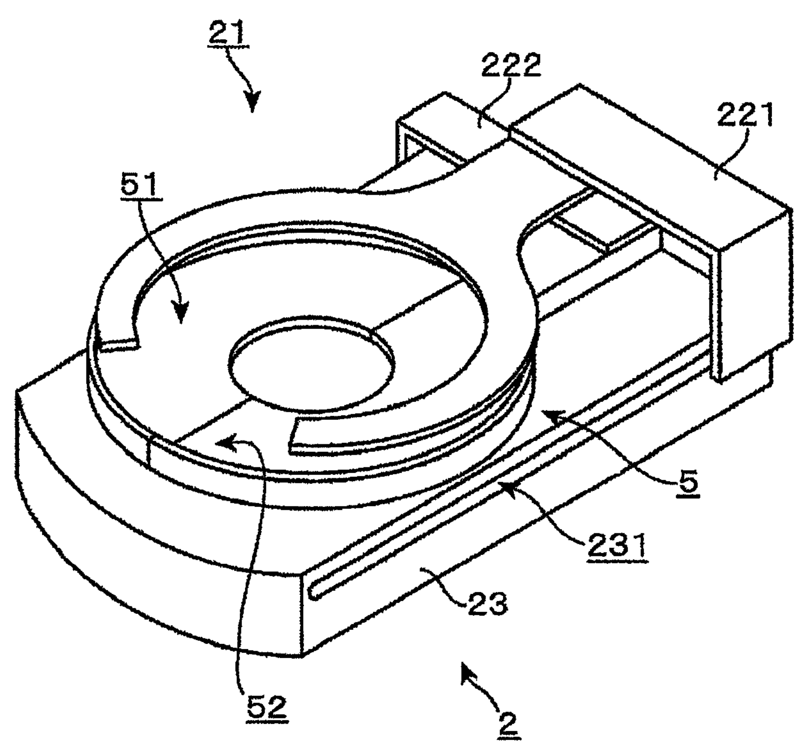
FIG. 5 is a perspective view of the wafer carrying apparatus.

As shown in FIG. 1, wafer carrying apparatus 2 is provided within carrying path 141 of liquid processing unit 14, and is configured to advance and retreat along a travel rail 201 provided in carrying path 141 in the front and rear directions. Also, as shown in FIGS. 4 and 5, wafer carrying apparatus 2 according to the present embodiment includes two carrying arms 21 and 5. A first carrying arm 21 supports wafer W with no liquid thereon, and a second carrying arm 5 supports wafer W with a liquid remained thereon.

Each of first carrying arm 21 and second carrying arm 5 can independently move in a horizontal direction by sliding an arm supporting member 221 or 222 provided at its end side along each of guide grooves 231 longitudinally provided in both lateral sides of a base 23. Also, guide groove 231 for sliding second carrying arm 5 is provided at the lateral side of base 23, which is shown in FIG. 4. The position where arm supporting members 221, and 222 are moved to the leading ends of guide grooves 231, corresponds to a transfer position to transfer wafer W between processing apparatuses 3 and 4. Meanwhile, the position where arm supporting members 221, and 222 are retreated to the trailing ends of guide grooves 231, corresponds to a carrying position to support wafer W during carrying of wafer W. Base 23, driving mechanism within base 23, and arm supporting member 222 correspond to a carrying tray moving mechanism of the present disclosure. As described above, although wafer carrying apparatus 2 includes two carrying arms 21 and 5 in the present embodiment, but the present disclosure is not limited thereto. Wafer carrying apparatus 2 may include only one carrying arm 5 which can support wafer W with the liquid remained thereon.

FIGS. 4 and 5 show the states where both carrying arms 21 and 5 are retreated to the carrying position. In this state, carrying arms 21, and 5 are disposed while they are stacked with each other in a top-bottom direction.

Also, as shown in FIG. 4, base 23 is provided on travel rail 201 via a driving mechanism 24. Driving mechanism 24 is configured to rotate and elevate around a vertical axis and to travel on the above described travel rail 201. Accordingly, wafer carrying apparatus 2 can rotate and elevate around the vertical axis, and can advance and retreat along travel rail 201.

As shown in FIGS. 1 and 5, first carrying arm 21 is a thin plate which takes, for example, a nearly annular shape, and supports the backside circumferential periphery of wafer W. From the end side of first carrying arm 21, a member for supporting first carrying arm 21 extends and connects to the above described arm supporting member 221. Meanwhile, the leading end side of first carrying arm 21 takes a partially cut-away annular shape which can cross with lifter 36 of liquid processing apparatus 3 or lifter 461 of supercritical processing apparatus 4.

Figure 6:
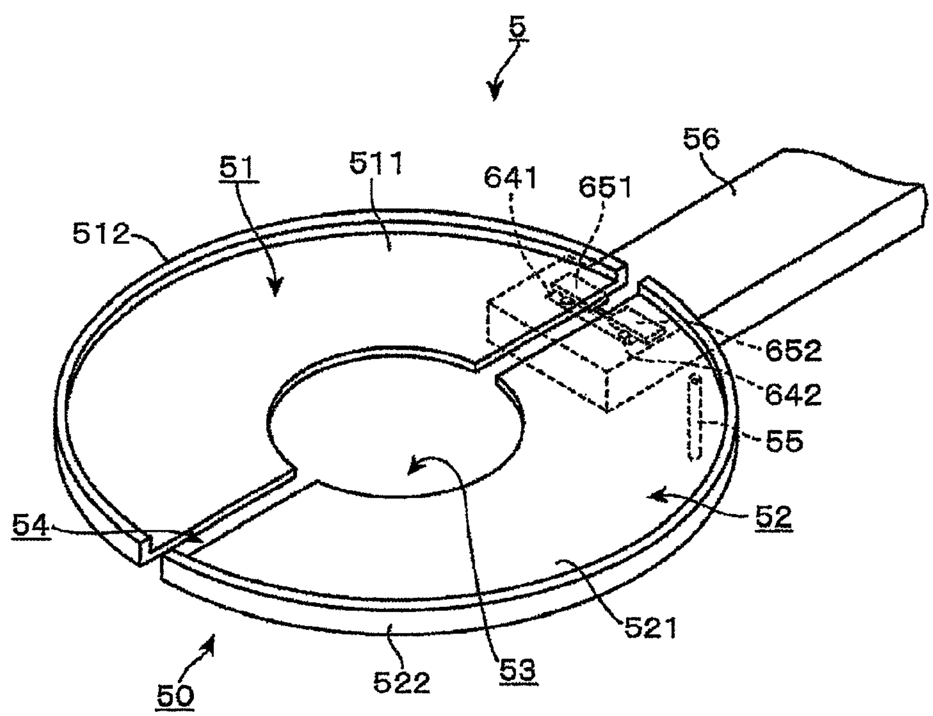
FIG. 6 is a perspective view of a second carrying arm provided in the wafer carrying apparatus.

Hereinafter, the detailed description of second carrying arm 5 will be described. As shown in FIG. 6, second carrying arm 5 includes a carrying tray 50, a supporting member 56, and a mechanism for temporarily forming a space. On carrying tray 50, wafer W which has been subjected to liquid processing is disposed. Supporting member 56 supports carrying tray 50. The mechanism forms a space for passing lifter 36 or 461 of liquid processing apparatus 3 or supercritical processing apparatus 4, so that wafer W can be transferred without interference between carrying tray 50 with lifter 36 or 461.

Carrying tray 50 is a tray-shape member which is supported by the leading end of supporting member 56 extending from the above described arm supporting member 222 in a sliding direction of second carrying arm 5. Carrying tray 50 includes two tray members 51 and 52, which are separated from each other at left and right sides from the perspective of the end side of supporting member 56. Each of tray members 51, and 52 has a nearly semicircular-shaped bottom plate 511, and 521. At the outer circumferential portion of each bottom plate 511 and 521, a circumferential side wall 512 and 522 is formed along the circumference. The height of circumferential side wall 512 and 522 is enough to immerse the entire wafer W in the liquid when the liquid is reservoired in the liquid reservoir space which will be described later. Then, tray members 51, and 52 are put together at cut-off surfaces, thereby forming the above mentioned carrying tray 50. On carrying tray 50, wafer W with a size of, for example, 300 mm may be disposed, and at the circumferential periphery of carrying tray 50, circumferential side walls 512 and 522 are provided.

In the central portion of bottom plates 511 and 521 of carrying tray 50, an opening 53 is formed. Opening 53 is opened in a circular shape so as to pass lifter 36 and 461 or wafer supporting part 362 and 463 of liquid processing apparatus 3 or supercritical processing apparatus 4 during the transfer of wafer W. Also, in carrying tray 50, a mechanism which temporarily forms a pass-through space 54 for passing lifter 36 or 461 supporting wafer W from opening 53 toward the outside of carrying tray 50 is provided. Hereinafter, the detailed configuration of this mechanism will be described.

Figure 7:
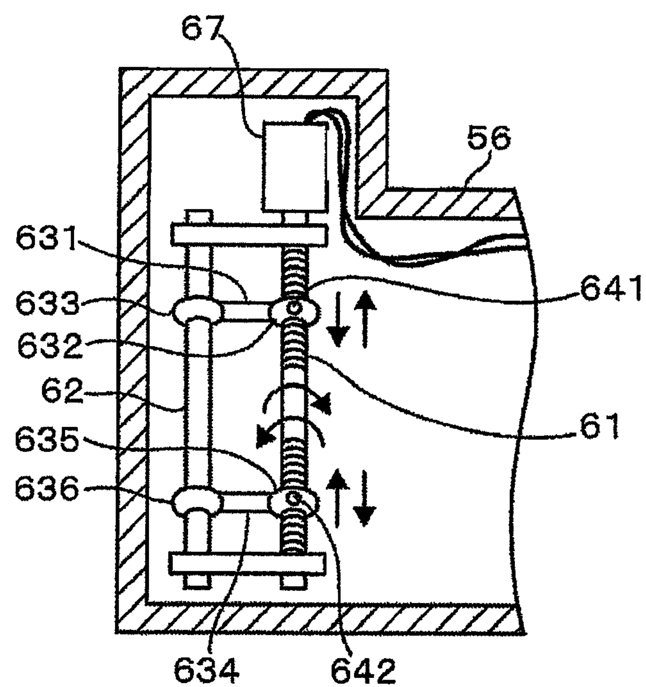
FIG. 7 is an explanatory view illustrating a mechanism for driving a carrying tray provided in the second carrying arm.

In the mechanism forming pass-through space 54, each tray member 51, and 52 is fixed to supporting member 56 via a fixing member 651, and 652. Fixing members 651, and 652 can horizontally slide in a direction perpendicular to supporting member 56's extending direction by a mechanism provided within supporting member 56. As shown in FIG. 7, supporting member 56 has a hollow inner space. At the leading end of the hollow inner space, a travel rail 61 for traveling fixing members 651, and 652 is provided.

Travel rail 61 is a rod-shaped member which is disposed along the traveling direction of fixing members 651, and 652. In the area where fixing members 651, and 652 of travel rail 61 travel, male screws are formed in opposite directions. The areas where opposite directional male screws are formed are inserted in travel rings 632 and 635 formed with corresponding female screws. Each of travel rings 632, and 635 is provided with an upwardly extending supporting member 641 and 642. The above described fixing members 651, and 652 are fixed at the leading end of supporting members 641, and 642.

Also, within supporting member 56, for example, a circular rod-shaped guide rail 62 is disposed, which is nearly parallel to travel rail 61. Guide rail 62 is inserted in two guide rings 633, and 636. As shown in FIG. 7, at one side, travel ring 632 and guide ring 633 are connected to each other via a connecting member 631, and at the other side, travel ring 635 and guide ring 636 are connected to each other via a connecting member 634. Also, even when travel rail 61 rotates, travel rings 632 and 635 are not rotated. At one end of travel rail 61, a motor 67 is provided, which rotates travel rail 61. This allows each travel ring 632, and 635 to travel along travel rail 61 and guide rail 62.

Herein, in travel rail 61 where travel rings 632, and 635 travel, the above described opposite directional male screws are formed. Thus, when travel rail 61 is rotated in a predetermined direction, two travel rings 632, and 635 travel in mutually approaching directions. Meanwhile, when travel rail 61 is rotated in an opposite direction, two travel rings 632, and 635 travel in mutually spacing directions.

Figure 8:
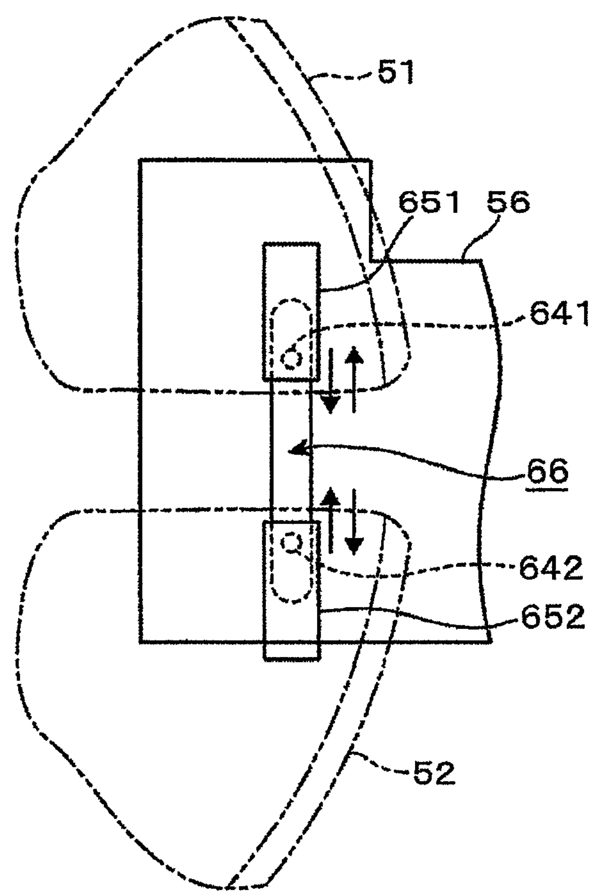
FIG. 8 is a second explanatory view illustrating a mechanism for driving the carrying tray.

As a result, fixing members 651, and 652 connected to travel rings 632, and 635 can travel in both mutually approaching directions and mutually spacing directions through conversion as shown in FIG. 8. Also, tray members 51 and 52 fixed by fixing members 651, and 652 slide according to the movement of fixing members 651, and 652. Through this configuration of carrying tray 50, two tray members 51 and 52 are slid, from a position where they are put together as shown in FIG. 5, to a position where pass-through space 54 is formed between two tray members 51 and 52 as shown in FIG. 6. In the present embodiment, travel rail 61, travel rings 632, and 635, motor 67 within supporting member 56, and fixing members 651, and 652 constitute a space forming mechanism to form pass-through space 54 in second carrying arm 5, and also correspond to a tray member moving unit to move tray members 51, and 52.

Figure 9A:
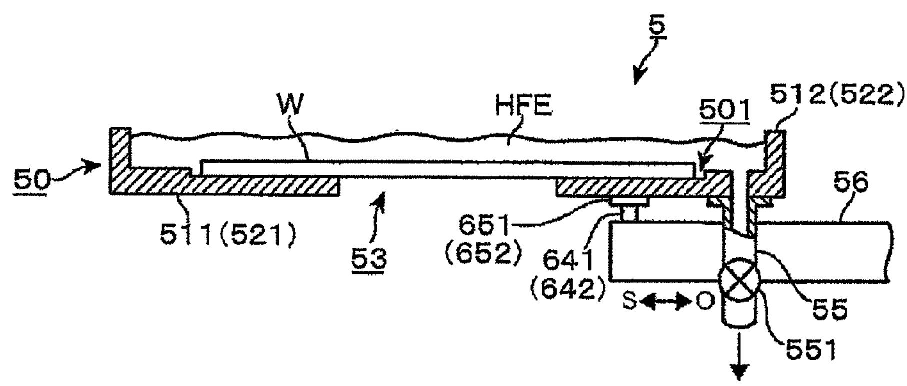
FIGS. 9A and 9B are explanatory views illustrating the state where a liquid is reservoired in a carrying tray.

In second carrying arm 5 provided with the above described configuration, wafer W is supported on carrying tray 50 in a state where two tray members 51 and 52 are put together as shown in FIG. 5. Carrying tray 50 has a concave portion 501 formed at the center portion thereof, as shown in FIG. 9A. Wafer W is disposed within concave portion 501. Also, in FIGS. 5 and 6, the illustration of concave portion 501 is omitted.

Herein, opening 53 opened at the center portion of carrying tray 50 has an opening diameter smaller than a diameter of wafer W, and is also opened within the above described concave portion 501. In a state where wafer W is disposed on carrying tray 50, opening 53 is placed in a closed state by wafer W. Accordingly, as shown in FIG. 9A, within a space (liquid reservoir space) surrounded by bottom plates 521, and 522, wafer W supported by bottom plates 521, and 522, and circumferential side walls 512, and 522, a liquid, for example, HFE used for supercritical drying, is reservoired. Thus, wafer W may be transferred while it is immersed within the reservoired HFE liquid [the liquid reaches the upper surface of wafer W].

Figure 9B:
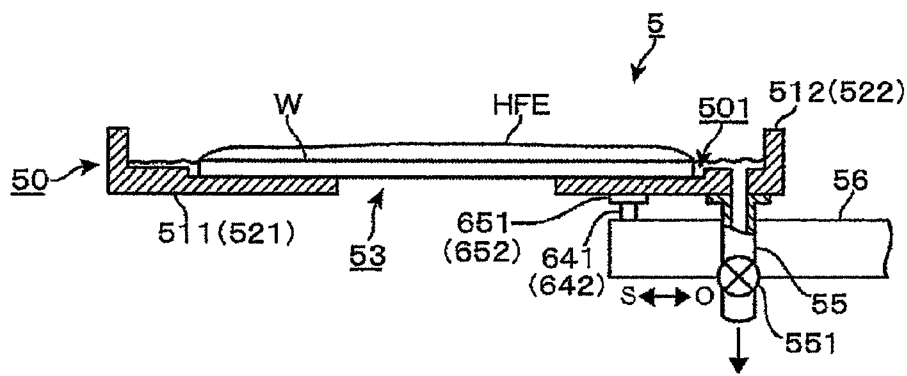

Herein, the transfer of wafer W with a liquid on the upper surface thereof is not limited to the instance where wafer W is immersed within the liquid, as shown in FIG. 9A, and includes the instance where the liquid is loaded on the entire upper surface of wafer W, as shown in FIG. 9B. The present embodiment described below is about the instance shown in FIG. 9A.

To one tray member 52 of carrying tray 50, as shown in FIG. 6 or FIG. 9A, a drainage line 55 for discharging HFE within a liquid reservoir space is further provided. In drainage line 55, an open/close valve 551 is provided. The open/close operation of open/close valve 551 discharges HFE toward a liquid receiving part 49 (which will be described later) provided within case 48 of supercritical processing apparatus 4.

Figure 10A:
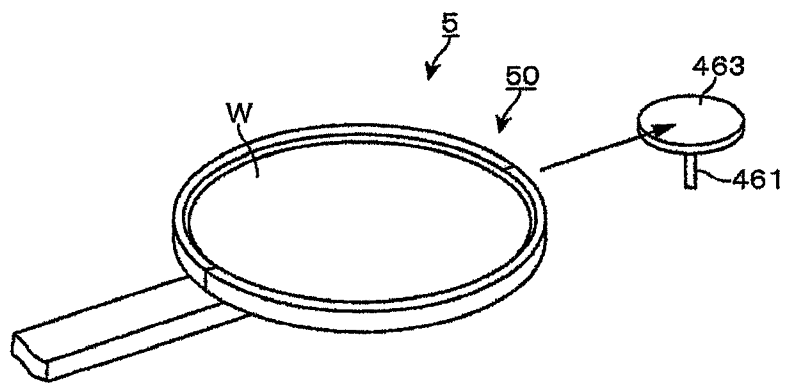
FIGS. 10A to 10C are explanatory views illustrating the state where a wafer is transferred by a second carrying arm.

Hereinafter, before the description on the entire operation of liquid processing system 1, the operation of second carrying arm 5 employing the above described configuration will be briefly described by exemplifying wafer W's transfer to/from lifter 461 of supercritical processing apparatus 4, with reference to FIGS. 10A to 10C. In transfer of wafer W, lifter 461 is placed in a stand-by state while projecting wafer supporting part 463 from the upper surface of seating unit 421, on which wafer W is to be disposed. Second carrying arm 5 horizontally advances toward the position above wafer supporting part 463 while supporting wafer W on carrying tray 50 [FIG. 10A].

Figure 10B:
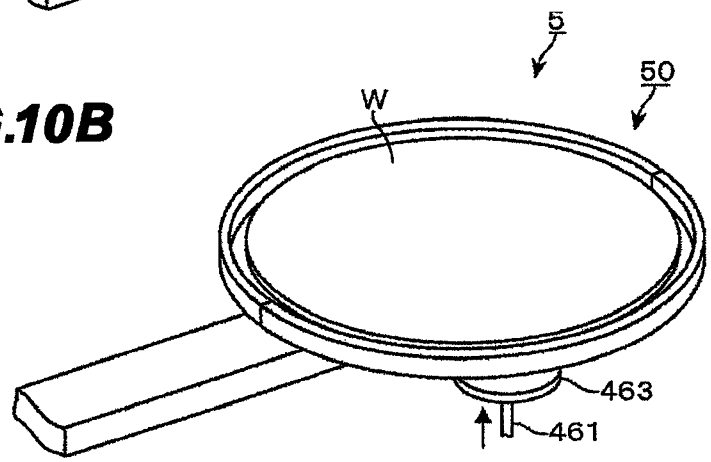
Figure 10C:
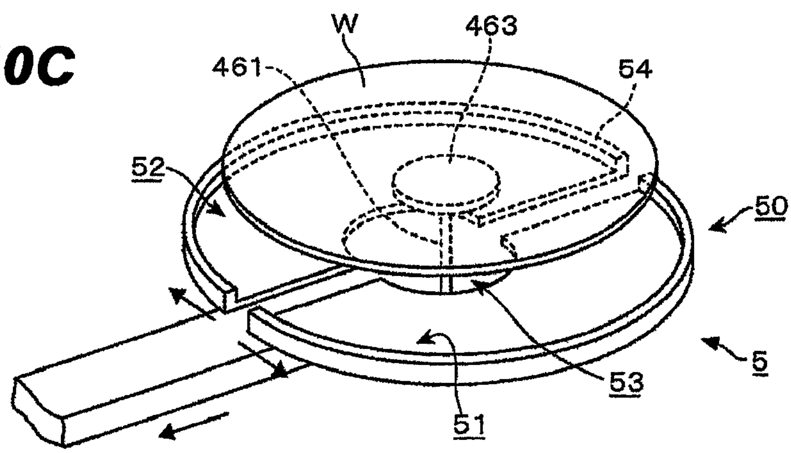

When carrying tray 50 reaches a transfer position of wafer W, lifter 461 is moved up, carrying tray 50 and lifter 461 are crossed with each other in upper and lower directions, and wafer supporting part 463 is passed through opening 53, thereby transferring wafer W from carrying tray 50 onto wafer supporting part 463 (FIG. 10B).

Once wafer W is transferred, tray members 51 and 52 moved toward left and right sides, thereby forming pass-through space 54. Then, carrying tray 50 is horizontally retreated in such a manner that lifter 461 can pass through pass-through space 54, and thereby the transfer of W is completed (FIG. 10C).

The above description is about the operation of transferring wafer W from second carrying arm 5 to lifter 461 of supercritical processing apparatus 4. Meanwhile, when wafer W is transferred from wafer supporting part 362 of liquid processing apparatus 3 to second carrying arm 5, second carrying arm 5 and lifter 36 are operated in an opposite manner to the above described transfer operation, that is, in the order of FIG. 10C→FIG. 10B→FIG. 10A. Also, as described later, the operation of crossing carrying tray 50 and lifter 36 with each other in upper and lower directions is performed by raising carrying tray 50, which is different from the above described wafer W transfer operation between second carrying arm 5 and supercritical processing apparatus 4.

Hereinafter, the configuration of liquid processing system 1 will be further described. In liquid processing system 1, as shown in FIG. 1, a controller 7 is connected. Controller 7 includes a computer provided with a CPU and a memory unit, which are not shown. In the memory unit, a program having a group of controlling steps (commands) for the operation of liquid processing system 1 is stored. The operation of liquid processing system 1 includes the sequential loading of wafer W into liquid processing apparatus 3 or supercritical processing apparatus 4, the liquid processing by liquid processing apparatus 3, the supercritical drying by supercritical processing apparatus 4, and the unloading of wafer W. This program is stored in a memory medium, such as a hard disk, a compact disk, a magneto-optical disk, a memory card, and the like, and the memory medium is provided in a computer.

Hereinafter, the operation of liquid processing system 1 according to the present embodiment, with the above described configuration, will be described. At the start of the processing in liquid processing system 1, carrying device 121 draws out wafer W from the carrier C disposed in carrier seating unit 11, and sequentially disposes it in transfer tray 131 within transfer unit 13.

Figure 11A:
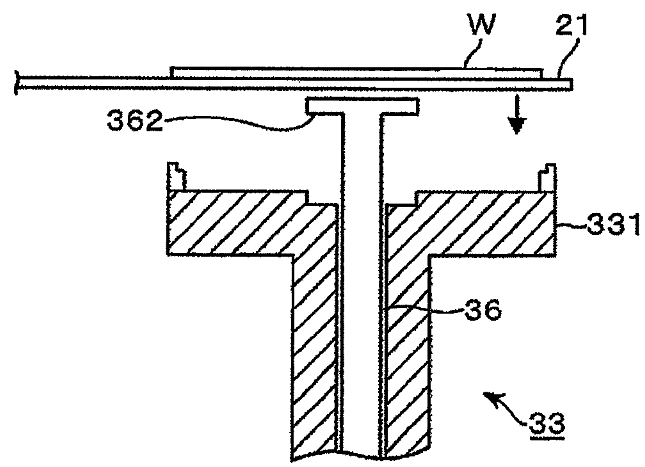
FIGS. 11A to 11C are first operational views illustrating the first operation of the liquid processing system.

Wafer carrying apparatus 2 draws out wafer W, as a target object, from carrying tray 131 by using first carrying arm 21, and then horizontally advances to one of liquid processing apparatuses 3 as shown in FIG. 1. Herein, lifter 36 is placed in a stand-by state while projecting wafer supporting part 362 from under plate 331 of wafer supporting means 33. As shown in FIG. 11A, first carrying arm 21 advancing into liquid processing apparatus 3 reaches the position above wafer supporting part 362, and then moves down.

Figure 11B:
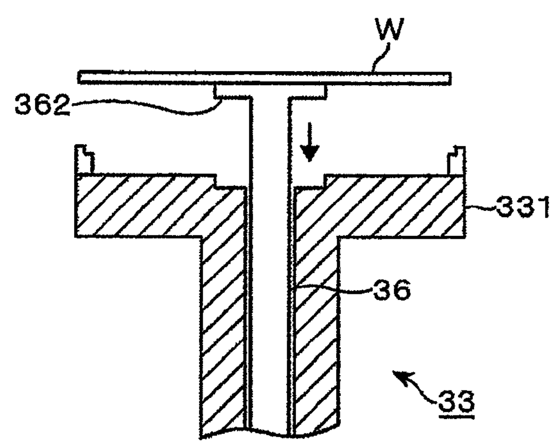
Figure 11C:
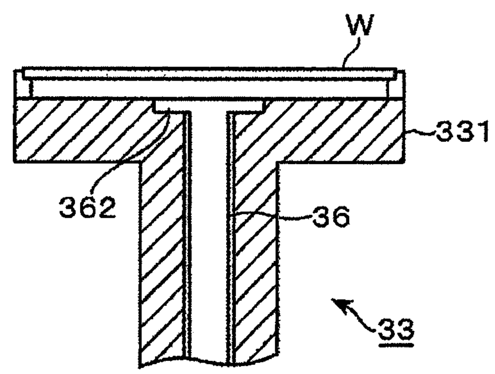

As shown in FIG. 11B, when wafer W is transferred from first carrying arm 21 to wafer supporting part 362, first carrying arm 21 is retreated to the outside of liquid processing apparatus 3. Then, wafer supporting part 362 is received within a concave portion of under plate 331 by lowering lifter 36, and thereby wafer W is supported by wafer supporting means 33 (FIG. 11C).

Once wafer W is loaded into liquid processing apparatus 3, nozzle arm 34 is moved to a position above the center portion of wafer W, and inner cup 32 is moved up to the processing position. Then, wafer supporting means 33 rotates wafer W while the SC1 liquid is supplied to the upper and lower surfaces of wafer W. Accordingly, on the upper and lower surfaces of wafer W, a film of a chemical liquid is formed, and thereby alkaline chemical liquid washing is performed.

When the alkaline chemical liquid washing is completed, inner cup 32 is moved to the retreat position. Then, pure water is supplied to nozzle arm 34 and chemical liquid supply path 361 of wafer supporting means 33, so as to perform a rinsing process for removing the SC1 liquid on the surface of wafer W, and then the supply of pure water to wafer W is stopped.

After the completion of the rinsing process, inner cup 32 is moved up again to the processing position. Then, the DHF liquid is supplied to the upper and lower surfaces of wafer W from nozzle arm 34 and chemical liquid supply path 361 while wafer W is rotated. Accordingly, on these surfaces of wafer W, a liquid film of the DHF liquid is formed, and thereby acidic chemical liquid washing is performed. Then, after a predetermined time, inner cup 32 is moved down to the retreat position. Next, the supply system for the chemical liquid is converted into a pure water supply mode, and a rinsing process is performed again.

After the rinsing process, from an HFE supplying nozzle provided at nozzle arm 34, HFE is supplied on the surface of a substrate supported by wafer supporting means 33, thereby substituting the liquid on wafer W's surface with the FIFE. Then, the liquid processing is completed.

Figure 12A:
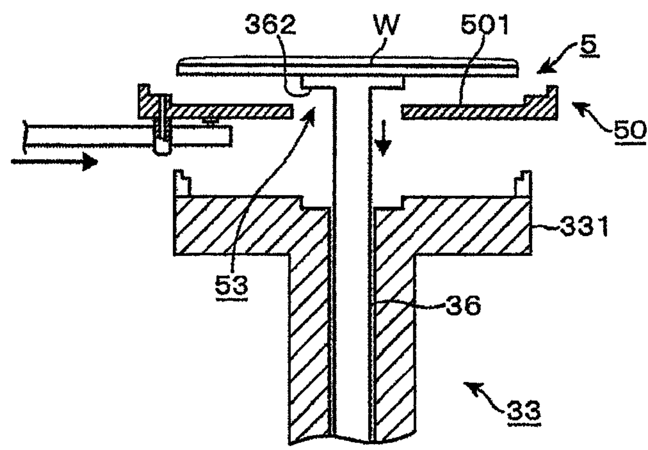
FIGS. 12A to 12C are second operational views illustrating the second operation of the liquid processing system.

After the completion of the liquid processing, wafer carrying apparatus 2 advances second carrying arm 5 with carrying tray 50 provided at the leading end thereof, instead of first carrying arm 21, into liquid processing apparatus 3. Then, wafer W which has been subjected to liquid processing is transferred. When wafer W is transferred, liquid processing apparatus 3 is in a stand-by state after raising lifter 36 in which wafer W with the HFE liquid loaded thereon is supported by wafer supporting part 362. Second carrying arm 5 forms pass-through space 54 by moving tray members 51 and 52, as shown in FIG. 6, and horizontally moves carrying tray 50 so that lifter 36 of liquid processing apparatus 3 side can pass through pass-through space 54. Then, as shown in FIG. 12A, carrying tray 50 advances to a position where opening 53 of carrying tray 50 reaches below wafer supporting part 362.

Figure 12B:
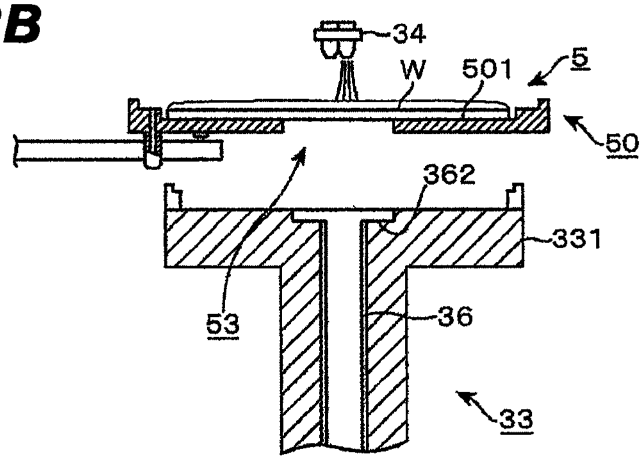
Figure 12C:
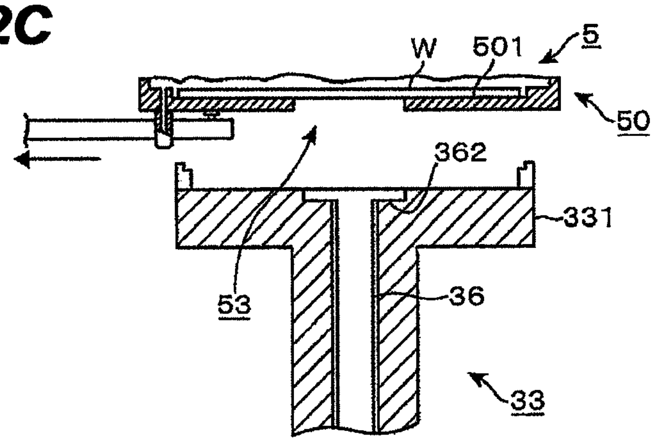

When carrying tray 50 advances to a predetermined position, lifter 36 is moved down, thereby transferring wafer W into concave portion 501 of carrying tray 50, as shown in FIG. 12B. Then, the HFE is supplied from an HFE supplying nozzle provided at the leading end of nozzle arm 34 toward carrying tray 50. As a result, when the HFE liquid is reservoired within carrying tray 50, and wafer W is immersed within the reservoired HFE liquid, as shown in FIG. 12C, carrying tray 50 is retreated and wafer W is unloaded from liquid processing apparatus 3.

After unloading wafer W from liquid processing apparatus 3, wafer carrying apparatus 2 travels on carrying path 141, and horizontally advances to one of supercritical processing apparatuses 4 as shown in FIG. 1. Herein, wafer W is immersed within the reservoired HFE liquid. Since the upper side of wafer W contacts with the liquid, wafer W is carried in a state where the pattern collapse by natural drying hardly occurs. Also, tray members 51 and 52 constituting carrying tray 50 are mutually put together, opening 53 is closed by wafer W, and carrying tray 50 has circumferential side walls 512 and 522 formed at the circumferential periphery thereof. Thus, the HFE reservoired in carrying tray 50 hardly overflows on carrying path 141.

Figure 13A:
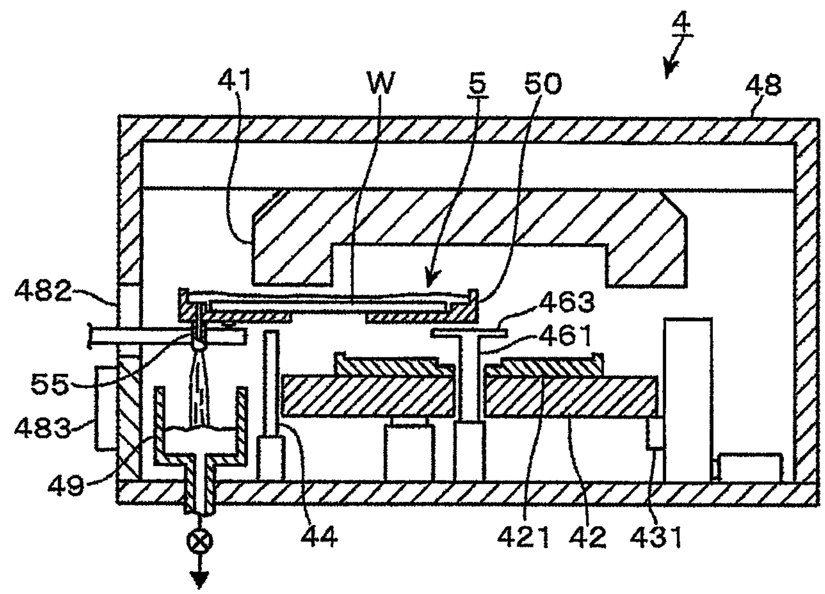
FIGS. 13A and 13B are third operational views illustrating the third operation of the liquid processing system.

When wafer W is loaded, supercritical processing apparatus 4 lowers bottom plate 42 and lifter 461, and thereby retreats them to a position where they do not interfere with the advancing route of carrying tray 50. Second carrying arm 5 advances into case 48 via a loading/unloading hole 482 of supercritical processing apparatus 4. As shown in FIG. 13A, second carrying arm 5 is stopped at a position where the lower end of drainage line 55 reaches above liquid receiving part 49 provided within case 48, and then open/close valve 551 shown in FIG. 9A is opened to discharge the HFE within carrying tray 50. Herein, carrying tray 50 may have a slope toward drainage line 55 in such a manner that the HFE can be easily discharged. Also, in FIGS. 13A, 13B, 14A, and 14B, the reference numeral 483 denotes a shutter of loading/unloading hole 482.

Figure 13B:
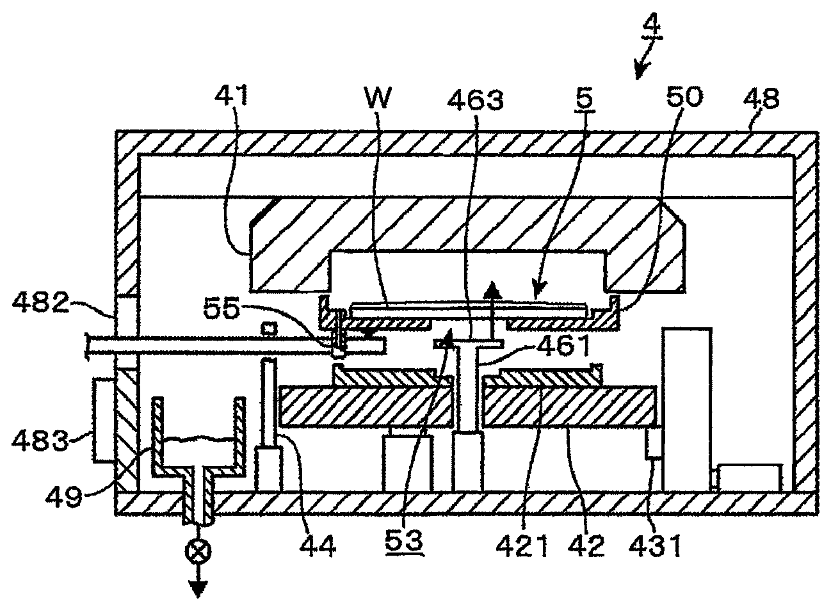
Figure 14A:
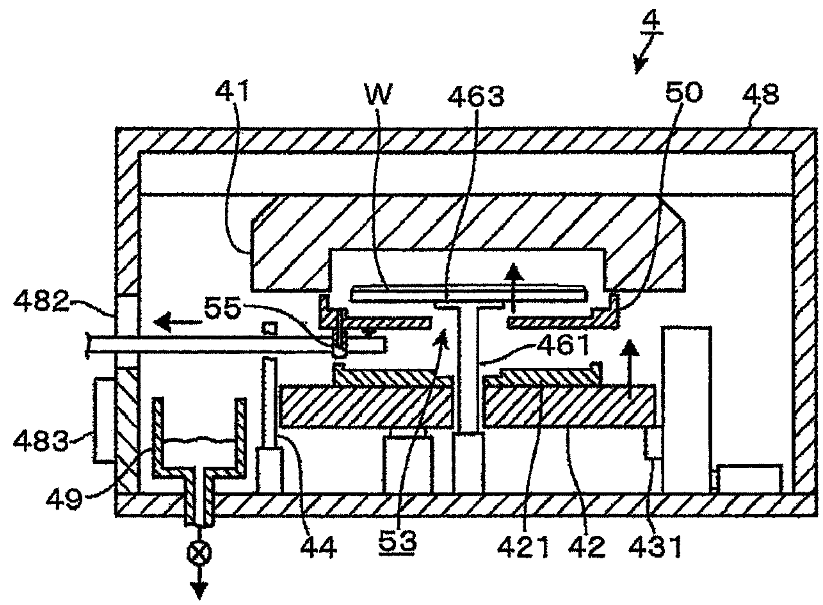
FIGS. 14A and 14B are fourth operational views illustrating the fourth operation of the liquid processing system.

As shown in FIG. 13A, the discharge of the HFE is performed by open/close valve 551 provided at the lateral side of wafer W. Even after the discharge of the HFE from the liquid reservoir space is completed, the HFE liquid remains on the upper surface of wafer W. When the discharge of the HFE is completed in this manner, carrying tray 50 is further advanced, and is stopped at a position where opening 53 of carrying tray 50 reaches above wafer supporting part 463 as shown in FIG. 13B. Then, as shown in FIG. 14A, lifter 461 is moved up, thereby passing wafer supporting part 463 through opening 53. Next, wafer W is transferred from carrying tray 50 to wafer supporting part 463, and wafer supporting part 463 is further moved up to a position where it does not interfere with the moving route of carrying tray 50.

Second carrying arm 5, as shown in FIG. 6, forms pass-through space 54 by moving tray members 51 and 52, and horizontally retreats carrying tray 50 in such a manner that lifter 461 of supercritical processing apparatus 4 side can pass through pass-through space 54. Then, second carrying arm 5 is retreated from the inside of case 48 of supercritical processing apparatus 4.

Figure 14B:
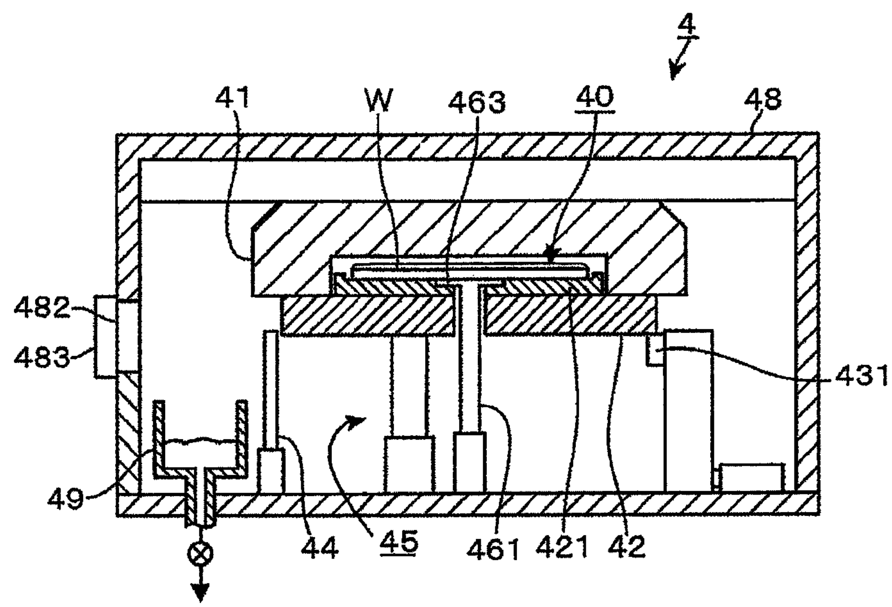

Then, as shown in FIG. 14B, supercritical processing apparatus 4 raises bottom plate 42 through the guiding of guide member 44, thereby receiving wafer supporting part 463 of lifter 461 within the concave portion of seating unit 421. Thus, wafer W is disposed on seating unit 421, and seating unit 421 is coupled with the aperture of processing receptacle 41, thereby receiving wafer W within processing space 40. Herein, supporting member 431 of support mechanism 43 moves up according to the movement of bottom plate 42, thereby supportedly fixing the back surface of bottom plate 42. Also, for the convenience of the illustration, FIGS. 13A, 13B, 14A, and 14B show only one support mechanism 43 and only one guide member 44.

As described above, wafer W carried by carrying tray 50 is immersed within the HFE just before it is received within processing space 40. Also, even after the HFE of carrying tray 50 is discharged and wafer W is received within processing space 40, the HFE liquid is loaded on the surface of wafer W so that the surface of wafer W is wet with the HFE liquid. Thus, in a state where pattern collapse due to the natural drying of the liquid hardly occurs, wafer W may be subjected to supercritical drying in supercritical processing apparatus 4.

When wafer W is received within processing space 40, and is disposed on seating unit 421 having heater 423 provided therein, the HFE is supplied from HFE supply path 411 into processing space 40 by opening HFE supply path 411 and exhaust path 413. Accordingly, the atmosphere within processing space 40 is discharged from exhaust path 413 so as to exchange the atmosphere within processing space 40 with the HFE. When the HFE is supplied into processing space 40 in a predetermined amount, for example, about 80% of the capacity of processing space 40, processing space 40 is tightly closed by closing HFE supply path 411, HFE discharge path 412, and exhaust path 413.

The HFE is continuously heated within tightly closed processing space 40 by heater 423. As the temperature of the HFE is increased, the HFE is expanded and then is placed in a supercritical state. After a predetermined time, HFE discharge path 412, and exhaust path 413 are opened, thereby decompressing the inside of processing space 40, while discharging the HFE from processing space 40. Herein, the HFE is discharged in the supercritical state from processing space 40. Thus, a surface tension hardly occurs on the surface pattern of wafer W, and thereby the HFE can be discharged without pattern collapse. Besides, the surface of wafer W may be placed in a dried state.

When the HFE is discharged and the inside of processing space 40 is decompressed, first carrying arm 21 for carrying a dried wafer W is advanced into supercritical processing apparatus 4. Then, wafer W is unloaded in reverse order to that of the loading operation. Wafer W drawn out from supercritical processing apparatus 4 is carried to transfer tray 131 by wafer carrying apparatus 2, while being supported by first carrying arm 21. Then, wafer W is drawn out by carrying device 121, and then is received within the carrier C of carrier seating unit 11. Through the repetition of these operations, liquid processing system 1 can perform washing and drying processes on a plurality of wafers W while both the liquid processing process and the supercritical drying process are carried out in liquid processing apparatus 3 and supercritical processing apparatus 4.

Liquid processing system 1 according to the present embodiment can achieve the following advantages. Due to the HFE reservoired in carrying tray 50 supporting wafer W, wafer W is carried while being immersed within the reservoired HFE liquid (in a state where the upper surface of wafer W contacts with HFE), and supercritical drying can be initiated while the liquid remains on the surface of wafer W (in a state where the liquid is adhered on the upper surface). Thus, through this apparatus with such a simple configuration, the pattern collapse occurring on the surface of wafer W can be inhibited. Also, since carrying tray 50 and second carrying arm 5 are integrated, the apparatus configuration or the operation control can be simple, compared to a conventional substrate carrying device for carrying wafer W in a state where the upper and lower surfaces of wafer W are covered. Also, due to the integrated configuration of carrying tray 50 and second carrying arm 5, just after the transfer of wafer W, a liquid (HFE in the present embodiment) is supplied to carrying tray 50, and wafer W is unloaded and is directly loaded into supercritical processing apparatus 4. This contributes to the improvement of throughput in the entire carrying time. Also, in tray members 51 and 52 of carrying tray 50, opening 53 is formed in such a manner that elevating members (lifters 36 and 461, and wafer supporting parts 362 and 463) provided in liquid processing apparatus 3 and supercritical processing apparatus 4, to which wafer W is transferred, can be passed through opening 53. Also, in carrying tray 50, pass-through space 54 is temporarily formed during the transfer of wafer W. Pass-through space 54 is formed for passing elevating members through from opening 53 to the outside of carrying tray 50, which allows carrying tray 50 to be horizontally moved without interference with elevating members.

In the above described embodiment, the HFE which is the same kind of fluid as that used for supercritical drying is supplied to carrying tray 50, so that the HFE liquid is reservoired, and wafer W is carried while immersed within the HFE liquid. However, the liquid to be supplied to carrying tray 50 is not limited to the same kind of material as the fluid which is to be placed in a supercritical state within supercritical processing apparatus 4. A different kind of liquid from the fluid, for example, IPA, may be supplied, so that an IPA liquid is reservoired, and wafer W is carried while contacting the upper surface of wafer W contacts with IPA.

Figure 15:
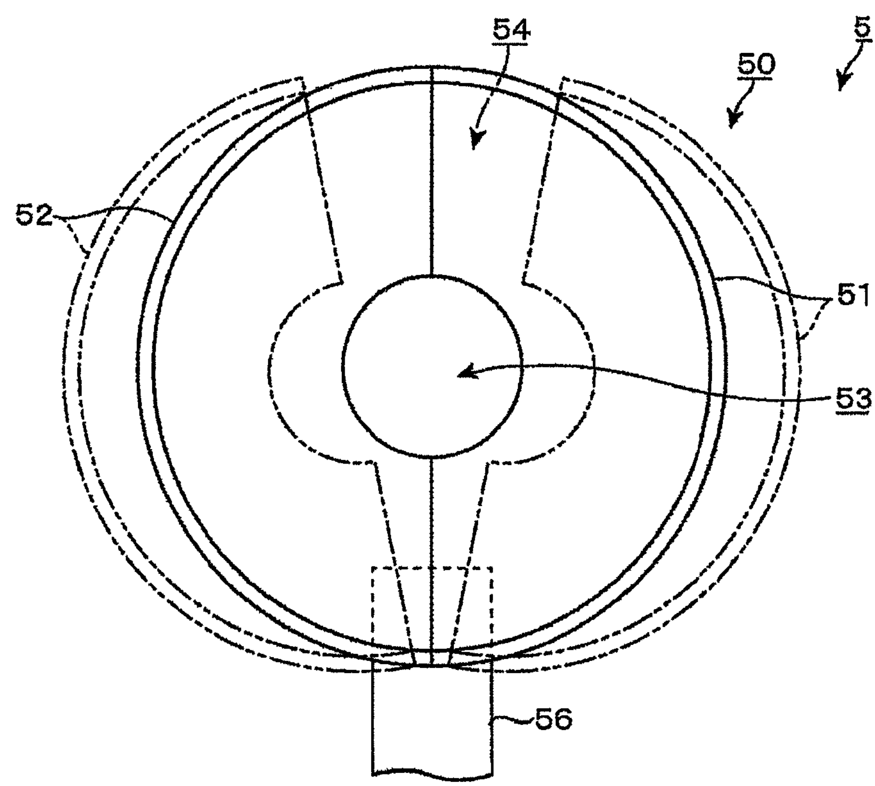
FIG. 15 is a plan view illustrating of a second carrying arm according to another embodiment.

Herein, in forming pass-through space 54 for passing elevating members (lifters 36 and 461, and wafer supporting parts 362 and 463) of liquid processing apparatus 3 and supercritical processing apparatus 4 through from opening 53 to the outside of carrying tray 50, the present disclosure is not limited to the horizontal sliding of tray members 51 and 52 as described with reference to FIGS. 6 to 8. For example, as shown in FIG. 15, in order to form pass-through space 54, tray members 51 and 52 may be rotated in such a manner that the contact lines can be separated from each other.

Figure 16:
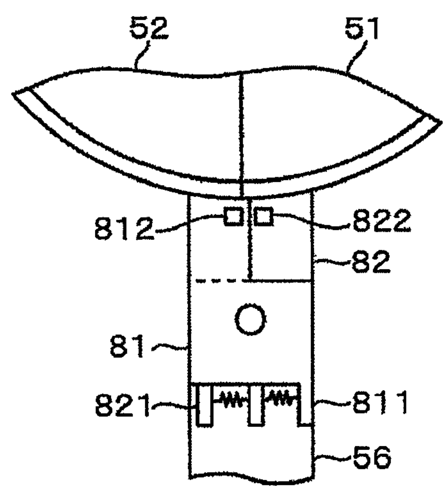
FIG. 16 is a first explanatory view illustrating the configuration of a mechanism for driving a carrying tray according to another embodiment.
Figure 17:
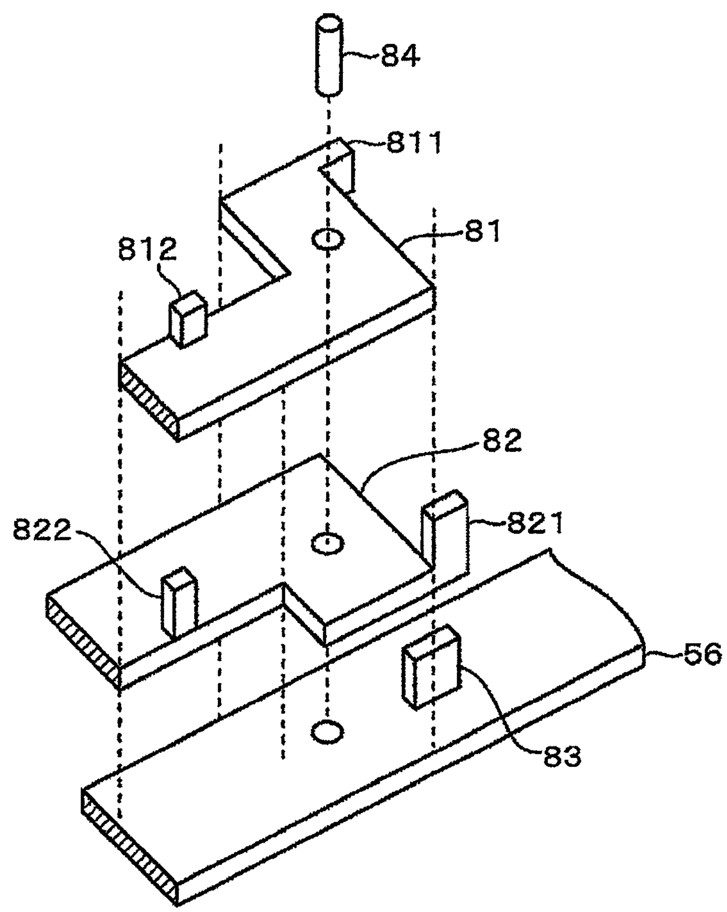
FIG. 17 is a second explanatory view illustrating a mechanism for driving a carrying tray according to another embodiment.
Figure 18:
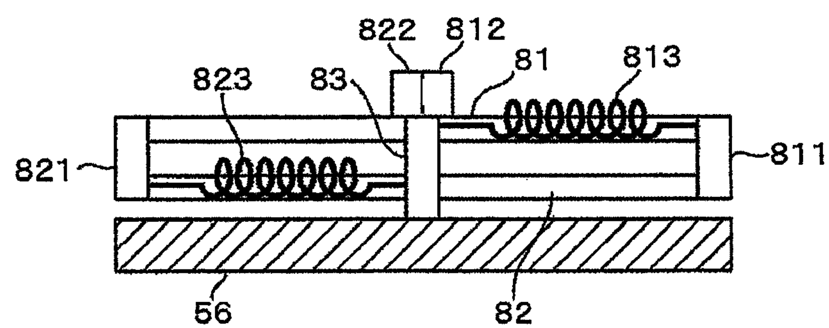
FIG. 18 is a third explanatory view illustrating a mechanism for driving a carrying tray according to another embodiment.

Hereinafter, a driving mechanism for tray members 51 and 52 will be briefly described. As shown in FIGS. 16 to 18, tray members 51 and 52 are attached to the leading end of a first operating piece 81 and a second operating piece 82. First operating piece 81 and second operating piece 82 are provided in the leading end portion of a thin and long plate-type supporting member 56. First operating piece 81 supporting tray member 52, as shown in FIG. 17, is an L-shaped member with a bent end side, and second operating piece 82 supporting tray member 51 is an L-shaped member whose end side is bent in the opposite direction to that of first operating piece 81.

These two operating pieces 81, and 82 are disposed in an upper/lower position in such a manner that the bent portions are overlapped with each other. Through the bent portions, a common rotating shaft 84 is passed. The lower end of rotating shaft 84 is fixed on the upper surface of supporting member 56, so that operating pieces 81, and 82 can rotate around rotating shaft 84.

On the upper surface of supporting member 56, an attaching member 83 is provided in a nearly vertical direction. Attaching member 83 is provided at the center position along the width direction of supporting member 56, and at the rear side of operating pieces 81, and 82, while having the same height as the upper surface of first operating piece 81. Meanwhile, as shown in FIGS. 17 and 18, at the rear positions of operating pieces 81, and 82, and at the leading ends of bent portions, projections 811 and 821 are provided in a nearly vertical direction with respect to the upper surface of supporting member 56. Projections 811 and 821 have the nearly same height as that of attaching member 83. Between projection 811 of first operating piece 81 side and attaching member 83, and between projection 821 of second operating piece 82 side and attaching member 83, tension springs 813 and 823 are provided, respectively. Tension springs 813 and 823 are always biased to a contraction/retreat direction. As a result, the two upper/lower overlapped operating pieces 81 and 82 are subjected to restoring forces of tension springs 813 and 823. Thus, as shown in FIG. 16, the L-shaped and reverse-L-shaped members extending to the attachment positions of tray members 51 and 52 are disposed in such a manner that their leading ends are nearly parallel to each other. As a result, tray members 51 and 52 are integrated by putting together, and thereby form carrying tray 50.

Meanwhile, at the above described leading ends of two operating pieces 81 and 82, electromagnets 812 and 822 are provided in such a manner that they are opposed to each other, as shown in FIGS. 16 to 18. Electromagnets 812 and 822 are subjected to a repulsive force by application of an electric current. When electromagnets 812 and 822 are operated, a repulsive force against the restoring forces of tension springs 813 and 823 is acted. Accordingly, operating pieces 81 and 82 are rotated along the circumference of rotating shaft 84, and thereby tray members 52 and 51 are rotated in a clockwise and a counterclockwise directions, respectively. As a result, pass-through space 54 is formed.

Figure 19A:
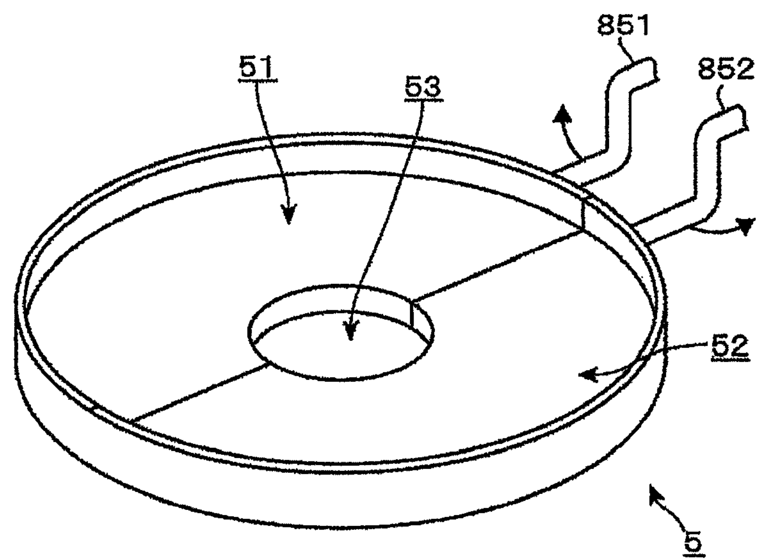
FIGS. 19A and 19B are perspective views illustrating a second carrying arm according to a further embodiment.
Figure 19B:
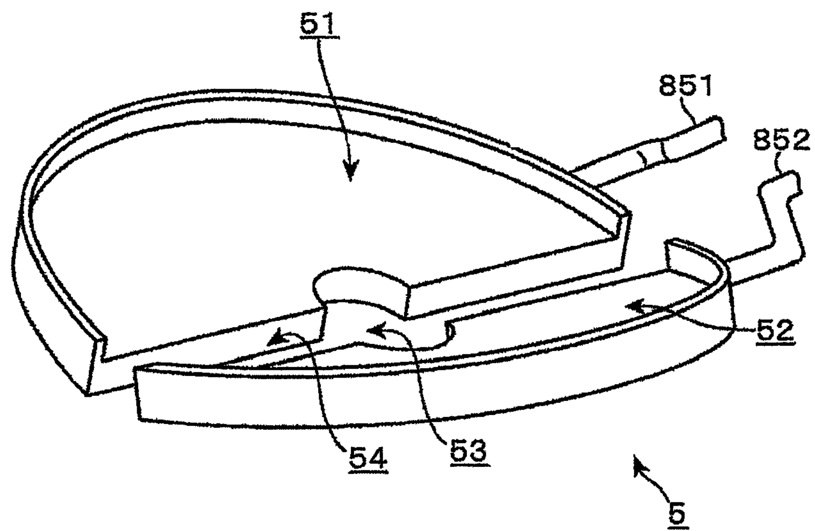
Figure 20:
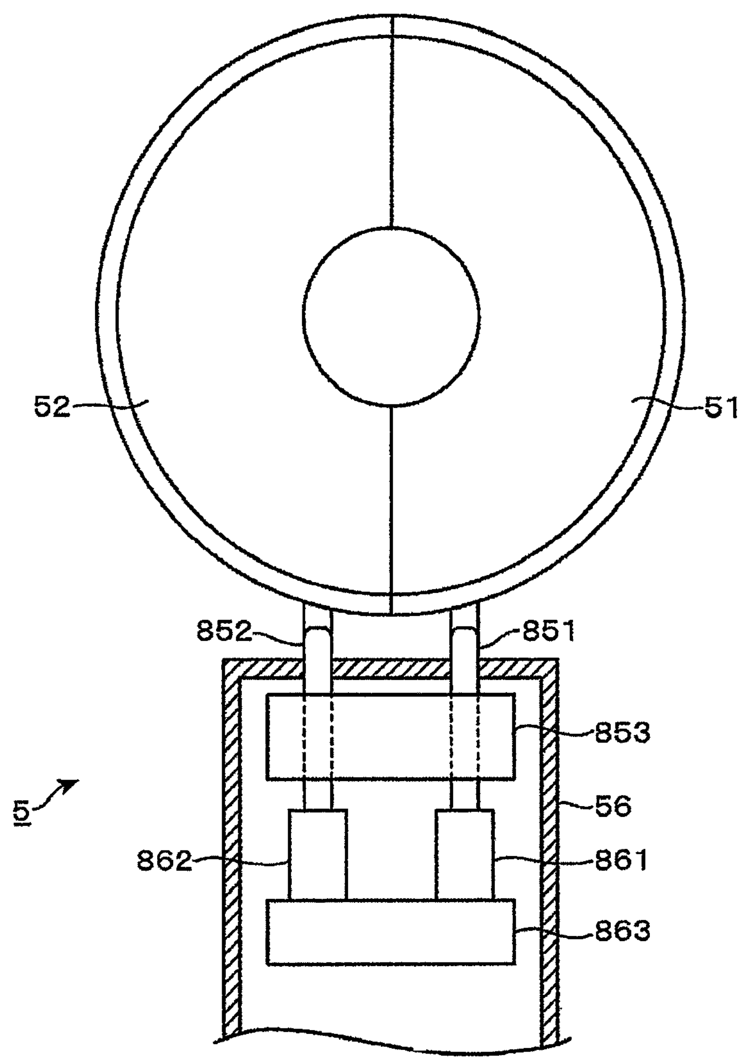
FIG. 20 is an explanatory view illustrating the configuration of a mechanism for driving a carrying tray according to a further embodiment.
Figure 21:
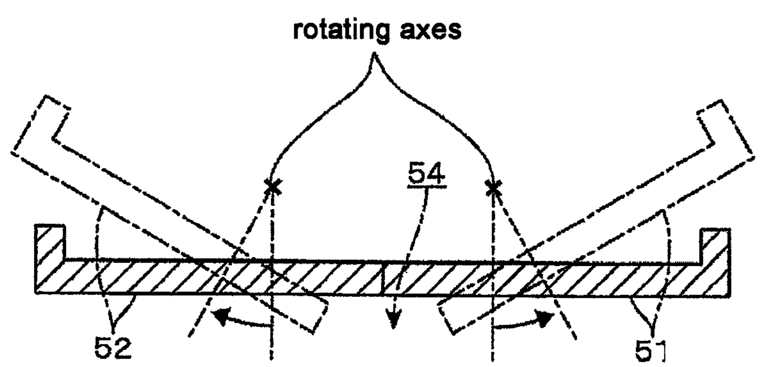
FIG. 21 is an explanatory view illustrating the state where the carrying tray according to a further embodiment is driven.

Also, in another embodiment, as shown in FIGS. 19A and 19B, tray members 51 and 52 may be rotated to the left and right sides in a pendulum manner, thereby forming pass-through space 54. In this case, as shown in FIGS. 19A, 19B and 20, at the leading ends of crankshafts 851 and 852, which extend in parallel with each other, tray members 51, and 52 are fixed. Tray members 51 and 52 may be rotated in a pendulum manner along the rotating axes positioned above tray members 51 and 52, as shown in FIG. 21, by rotating Crankshafts 851 and 852 with motors 861 and 862, thereby forming pass-through space 54. In FIG. 20, the reference numeral 853 denotes a guide member for supporting crankshafts 851 and 852, and the reference numeral 863 denotes a motor fixing member for fixing motors 861 and 862.

Figure 22A:
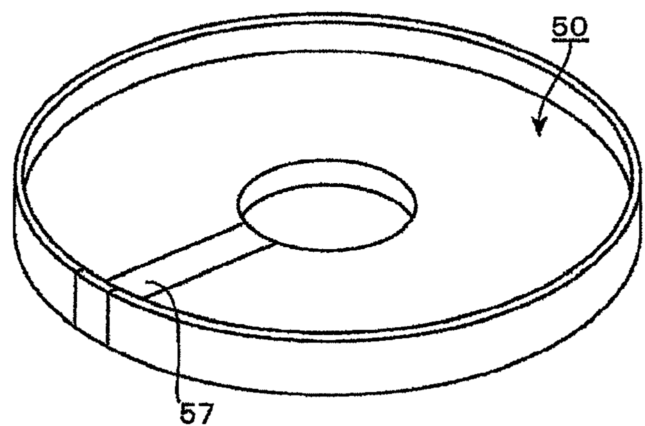
FIGS. 22A and 22B are perspective views illustrating a second carrying arm according to a still further embodiment.
Figure 22B:
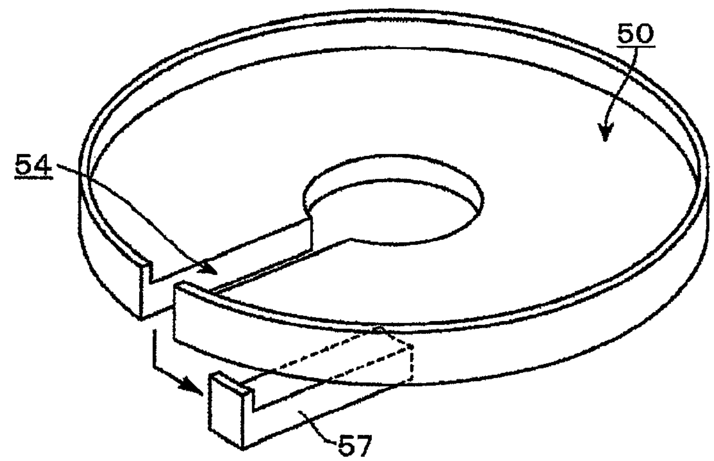

Also, in the above described embodiments, carrying tray 50 is divided into two tray members 51 and 52, and pass-through space 54 is formed by moving tray members 51 and 52 in mutually spaced directions, but the present disclosure is not limited thereto. In other words, the formation of pass-through space 54 is not limited to the division of carrying tray 50 into two semicircular-shaped tray members 51 and 52. For example, as shown in FIGS. 22A and 22B, carrying tray 50 may be cut-off according to the shape of pass-through space 54 to form a cut-off member 57. Cut-off member 57 may be moved between a position where Cut-off member 57 is integrated with carrying tray 50 by inserting to pass-through space 54 (FIG. 22A) and a position where Cut-off member 57 is removed to form pass-through space 54 (FIG. 22B).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate carrying apparatus comprising:

a carrying tray including:

two semi-annular planar members complementing each other to form a closed annulus with an outer diameter and an inner diameter, the closed annulus sized to support a substrate that has a diameter between the inner and outer diameters of the closed annulus; and a circumferential side wall provided around the outer radius of each of the two semi-annular planar members, to be spaced apart from an edge of the substrate, and wherein the height of the circumferential side wall above the planar surface of the closed annulus exceeds the height of the substrate;

a carrying tray moving mechanism to horizontally move the carrying tray; and a space forming mechanism to temporarily form a horizontal space between the two semi-annular planar members, wherein when the semi-annular planar members hold a substrate and are not spaced apart by the space forming mechanism, a liquid reservoir space is formed around the perimeter of and above the substrate in the volume bounded by the circumferential side wall, such that the carrying tray is to carry the substrate with liquid remaining on the substrate.

2. The substrate carrying apparatus as claimed in claim 1, wherein a bore hole with a drainage line is provided through one of the semi-annular planar member, located in a space between the perimeter of the substrate and the inner radius of the circumferential side wall, the drainage line being adapted to discharge the liquid within the liquid reservoir space and comprising an open/close valve.

3. A substrate processing system comprising:

a liquid processing apparatus to supply a liquid on a surface of a substrate to wash the surface;

a supercritical processing apparatus to dispose the substrate on a seating unit within a processing receptacle, the supercritical processing apparatus using supercritical-state processing to remove from the substrate any liquid supplied by the liquid processing apparatus; and a substrate carrying apparatus to carry the substrate to and from the liquid processing apparatus and the supercritical processing apparatus, the substrate carrying apparatus carrying the substrate from the liquid processing apparatus to the supercritical processing apparatus with a liquid remained thereon, and transferring the substrate to and from an elevating member supporting a back surface of the substrate, the substrate carrying apparatus comprising:

a carrying tray including, two semi-annular planar members complementing each other to form a closed annulus with an outer diameter and an inner diameter, the closed annulus sized to support a substrate that has a diameter between the inner and outer diameters of the closed annulus; and a circumferential side wall provided around the outer radius of each of the two semi-annular planar members to be spaced apart from an edge of the substrate, and wherein the height of the circumferential side wall above the planar surface of the closed annulus exceeds the height of the substrate;

a carrying tray moving mechanism to horizontally move the carrying tray; and a space forming mechanism to temporarily form a horizontal space between the two semi-annular planar members, wherein when the semi-annular planar members hold a substrate and are not spaced apart by the space forming mechanism, a liquid reservoir space is formed around the perimeter of and above the substrate in the volume bounded by the circumferential side wall, such that is configured to carry the substrate with liquid remaining on the substrate.

4. The substrate processing system as claimed in claim 3, wherein the supercritical processing apparatus configured to place the liquid remaining on the substrate in a supercritical state by applying high temperature and high pressure.

5. The substrate processing system as claimed in claim 3, wherein the supercritical processing apparatus configured to dry the liquid remaining on the substrate by dissolving the liquid with a supercritical fluid.

6. The substrate processing system as claimed in claim 3, wherein a bore hole with a drainage line is provided through one of the semi-annular planar member, located in a space perimeter of the substrate and the inner radius of the circumferential side wall, the drainage line being adapted to discharge the liquid within the liquid reservoir space and comprising an open/close valve.

* * * * *